US011860691B2

United States Patent
La et al.

(10) Patent No.: US 11,860,691 B2
(45) Date of Patent: Jan. 2, 2024

(54) DISPLAY DEVICE AND ELECTRONIC DEVICE INCLUDING THE SAME

(71) Applicant: Samsung Display Co., Ltd., Yongin-si (KR)

(72) Inventors: Sojeong La, Suwon-si (KR); Dongjin Park, Seongnam-si (KR); Jaiku Shin, Hwaseong-si (KR); Jongmin Yang, Cheonan-si (KR); Gyeongho Jeong, Hwaseong-si (KR); Sung Chul Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 25 days.

(21) Appl. No.: 17/574,872

(22) Filed: Jan. 13, 2022

(65) Prior Publication Data

US 2022/0397934 A1 Dec. 15, 2022

(30) Foreign Application Priority Data

Jun. 14, 2021 (KR) .................. 10-2021-0077029

(51) Int. Cl.
*G06F 1/16* (2006.01)
(52) U.S. Cl.
CPC .......... *G06F 1/1616* (2013.01); *G06F 1/1643* (2013.01); *G06F 1/1686* (2013.01)
(58) Field of Classification Search
CPC .... G06F 1/1616; G06F 1/1643; G06F 1/1686; G06F 3/0412; G06F 3/046; G06F 2203/04102; G06F 2203/04103; G06F 2203/04104; G06F 1/1652; G06F 3/044; G06F 1/1605; H10K 59/872; G09F 9/301; C08L 101/00
See application file for complete search history.

(56) References Cited

U.S. PATENT DOCUMENTS

| | | | |
|---|---|---|---|
| 10,074,824 | B2 | 9/2018 | Han et al. |
| 11,281,258 | B2 | 3/2022 | Park et al. |
| 2018/0142127 | A1* | 5/2018 | Park ............... C08G 59/22 |
| 2018/0181165 | A1* | 6/2018 | Park ............... B32B 37/12 |
| 2018/0196467 | A1 | 7/2018 | Watamura et al. |
| 2019/0014669 | A1* | 1/2019 | Ahn ............... G06F 1/1626 |

FOREIGN PATENT DOCUMENTS

| | | |
|---|---|---|
| CN | 111781999 | 10/2020 |
| CN | 213424443 | 6/2021 |
| KR | 10-2018-0036904 | 4/2018 |
| KR | 10-2020-0098758 | 8/2020 |
| KR | 10-2021-0016983 | 2/2021 |

OTHER PUBLICATIONS

International Search Report corresponding to International Application No. PCT/KR2022/008233 dated Sep. 7, 2022.

* cited by examiner

*Primary Examiner* — Elmito Breval

(74) *Attorney, Agent, or Firm* — KILE PARK REED & HOUTTEMAN PLLC

(57) ABSTRACT

A display device may include a window module and a display module including a first non-folding region, a second non-folding region, and a folding region disposed between the first non-folding region and the second non-folding region. The display module may include a damping layer, a color filter layer, a display panel, and a lower member, which are sequentially stacked below the window module, and the damping layer may include polymer.

21 Claims, 18 Drawing Sheets

DISPLAY DEVICE AND ELECTRONIC DEVICE INCLUDING THE SAME

CROSS-REFERENCE TO RELATED APPLICATION(S)

This U.S. non-provisional patent application claims priority to and the benefit of Korean Patent Application No. 10-2021-0077029 under 35 U.S.C. § 119, filed on Jun. 14, 2021, in the Korean Intellectual Property Office (KIPO), the entire contents of which are incorporated herein by reference.

BACKGROUND

The disclosure relates to an electronic device, and in particular, to a foldable electronic device.

A display device includes a display region which is activated by an electrical signal applied thereto. The display device senses an input, which is provided from the outside through the display region, and provides image information to a user through the display region. As various types of display devices have been developed, the shape of the display region has also been diversified.

SUMMARY

An embodiment of the disclosure provides a foldable display device including a digitizer with improved sensing sensitivity.

An embodiment of the disclosure provides a foldable display device with an improved impact-resistant property.

An embodiment of the disclosure provides a foldable display device which has high reliability even at low temperature.

According to an embodiment of the disclosure, a display device may include a window module and a display module including a first non-folding region, a second non-folding region, and a folding region disposed between the first non-folding region and the second non-folding region. The display module may include a damping layer, a color filter layer, a display panel, and a lower member. The damping layer, color filter layer, display panel, and lower member may be sequentially stacked below the window module, and the damping layer may include polymer.

In an embodiment, a thickness of the damping layer may be in a range of about 5 μm to about 30 μm.

In an embodiment, the window module may include a window protection layer and a thin glass substrate.

In an embodiment, a modulus value of the damping layer may be smaller than a modulus value of the window protection layer.

In an embodiment, the display device may further include an upper adhesive layer, which is disposed directly on a bottom surface of the damping layer. A thickness of the upper adhesive layer may be in a range of about 40 μm to about 60 μm.

In an embodiment, the display device may further include a panel protection layer disposed below the display panel, and a lower adhesive layer attaching the panel protection layer to the display panel. A thickness of the lower adhesive layer may be in a range of about 20 μm to about 30 μm.

In an embodiment, the lower member may include a support layer including a nonmetal and a digitizer disposed below the support layer.

In an embodiment, the nonmetal may be a reinforced fiber.

In an embodiment, the damping layer may include at least one of polyimide, polycarbonate, polyamide, triacetylcellulose, polymethylmethacrylate, and polyethylene terephthalate.

In an embodiment, the lower member may include a penetration hole that overlaps at least one of the first non-folding region and the second non-folding region in a plan view. The display panel may overlap the penetration hole in a plan view.

In an embodiment, the display device may further include an input sensor disposed between the color filter layer and the display panel.

According to an embodiment of the disclosure, a display device may include a display panel including a first non-folding region, a second non-folding region, and a folding region, a color filter layer disposed on the display panel, the color filter layer including color filter patterns and a division pattern, a damping layer disposed on the color filter layer, the damping layer including polymer, and a lower member disposed below the display panel.

In an embodiment, the lower member may include a penetration hole that overlaps at least one of the first non-folding region and the second non-folding region in a plan view. The display panel may overlap the penetration hole in a plan view.

In an embodiment, the lower member may include a panel protection layer disposed below the display panel, a support layer disposed below the panel protection layer, the support layer including a nonmetal, and a digitizer disposed below the support layer.

In an embodiment, the nonmetal may be a reinforced fiber.

In an embodiment, a thickness of the damping layer may be in a range of about 5 μm to about 30 μm.

According to an embodiment of the disclosure, an electronic device may include a display device including a first display region allowing for transmission of an optical signal, a second display region adjacent to the first display region, and a peripheral region adjacent to the second display region, and an electro-optical module disposed below the display device and overlapping the first display region in a plan view, the electro-optical module receiving the optical signal. The display device may include a window module and a display module including a first non-folding region, a second non-folding region, and a folding region disposed between the first non-folding region and the second non-folding region. The display module may include a damping layer, a color filter layer, a display panel, and a lower member. The damping layer, color filter layer, display panel, and lower member may be sequentially stacked below the window module. The damping layer may include polymer.

In an embodiment, the color filter layer may include color filter patterns and a division pattern.

In an embodiment, a thickness of the damping layer may be in a range of about 5 μm to about 30 μm.

In an embodiment, the electro-optical module may include a camera module.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
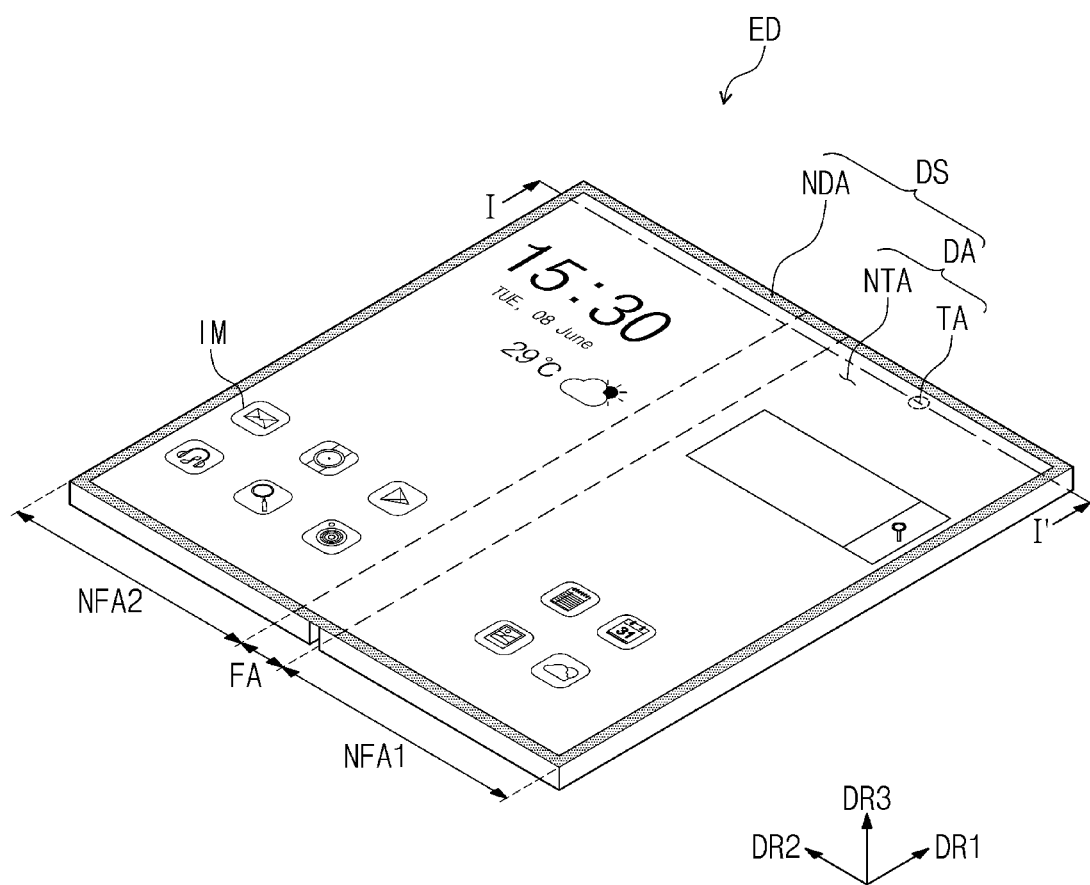
FIGS. 1A to 1C are schematic perspective views illustrating an assembled structure of an electronic device according to an embodiment of the disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the disclosure will now be described more fully with reference to the accompanying drawings, in which example embodiments are shown. Example embodiments of the disclosure may, however, be embodied in many different forms and should not be construed as being limited to the embodiments set forth herein; rather, these embodiments are provided so that this disclosure will be thorough and complete, and will convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms (or meanings) as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the disclosure should not be construed as limited to the particular shapes of regions illustrated herein but are to include deviations in shapes that result, for example, from manufacturing.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which example embodiments of the disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
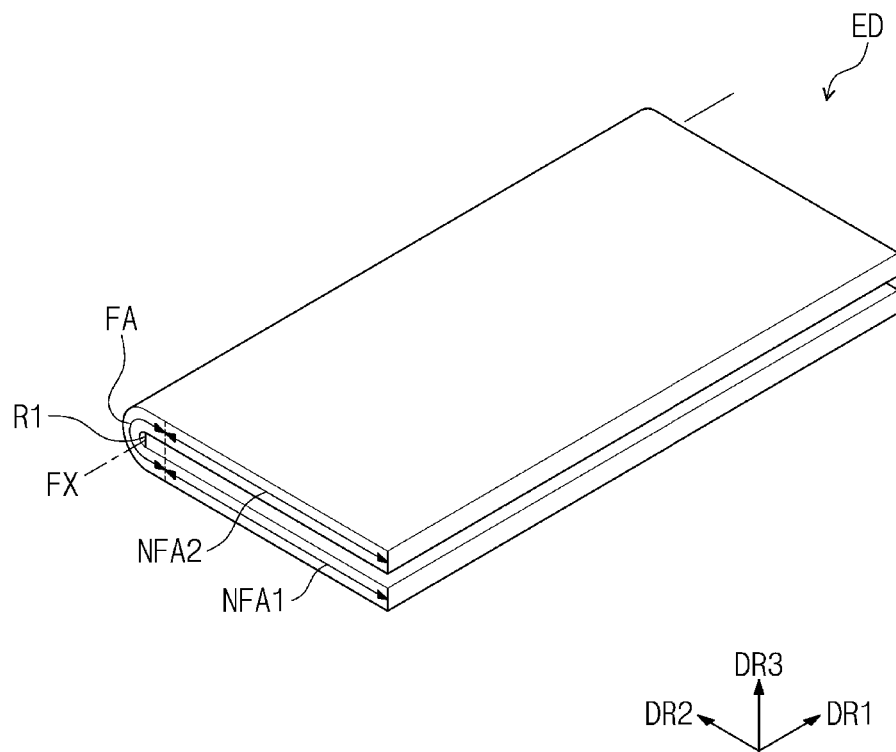
Figure 1C:
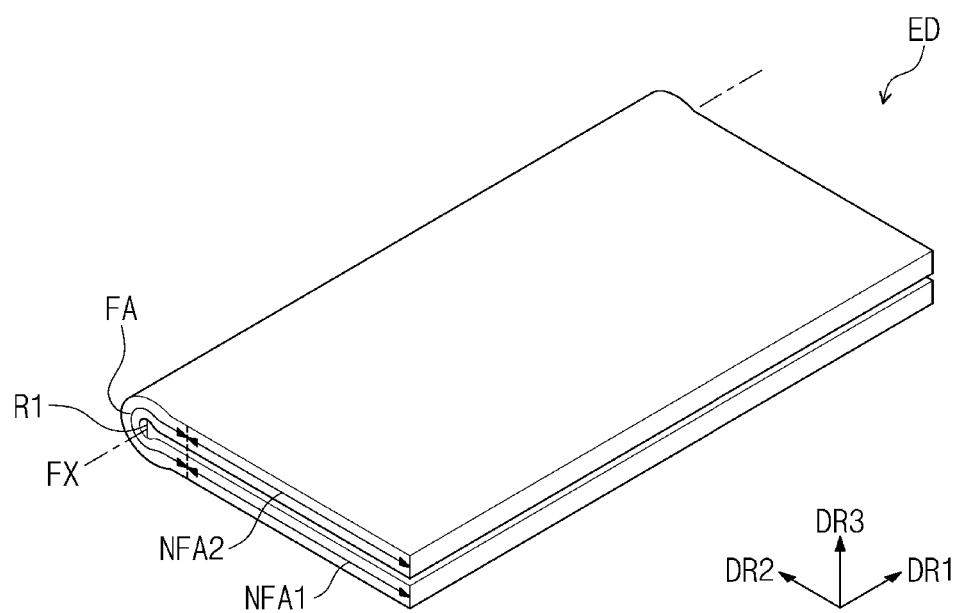

FIGS. 1A to 1C are schematic perspective views illustrating an assembled structure of an electronic device ED according to an embodiment. FIG. 1A illustrates the electronic device ED in an unfolded state, and FIGS. 1B and 1C illustrate the electronic device ED in a folded state.

Referring to FIGS. 1A to 1C, the electronic device ED may include a display surface DS, which is disposed in a plane defined by two different directions (e.g., a first direction DR1 and a second direction DR2). In the electronic device ED, the display surface DS may be used to provide an image IM to a user.

The display surface DS may include a display region DA and a non-display region NDA around the display region DA. The display region DA may be used to display the image IM, and the non-display region NDA may not be used to display the image IM. The non-display region NDA may be provided to surround the display region DA. However, the disclosure is not limited to this example, and the shape of the display region DA and the shape of the non-display region NDA may be variously changed.

The display region DA may include a first display region TA and a second display region NTA surrounding the first display region TA. The first display region TA may have higher optical transmittance than the second display region NTA and the non-display region NDA.

The first display region TA may be configured to allow for transmission of natural light, visible light, or infrared light. The electronic device ED may further include a sensor that obtains or captures an image of an external object from visible light passing through the first display region TA or determines proximity of an external object from infrared light passing through the first display region TA.

In an embodiment, the first display region TA may be continuously extended from the non-display region NDA, without any gap region therebetween. In an embodiment, the display region DA may include first display regions TA.

Hereinafter, a direction perpendicular to both of the first and second directions DR1 and DR2 will be referred to as a third direction DR3. Furthermore, the phrase "when viewed in a plan view" or "in a plan view" in the specification will be used to describe a structure viewed in the third direction DR3. Hereinafter, the first to third directions DR1, DR2, and DR3 may be directions indicated by first to third direction axes, respectively, and will be identified with the same reference numbers.

The electronic device ED may include a folding region FA and multiple non-folding regions NFA1 and NFA2. The non-folding regions NFA1 and NFA2 may include a first non-folding region NFA1 and a second non-folding region NFA2. In the second direction DR2, the folding region FA may be disposed between the first and second non-folding regions NFA1 and NFA2.

As shown in FIG. 1B, the folding region FA may be folded along a folding axis FX parallel to the first direction DR1. The folding region FA may have a specific curvature or curvature diameter R1. The electronic device ED may be inner-folded so that the first and second non-folding regions NFA1 and NFA2 face each other and the display surface DS is not exposed to the outside.

In an embodiment, the electronic device ED may be outer-folded so that the display surface DS is exposed to the outside. In an embodiment, the electronic device ED may be configured to alternately and repeatedly perform an unfolding operation and an inner-folding or outer-folding operation, but the disclosure is not limited to this example. In an embodiment, the electronic device ED may be configured to select one of an unfolding operation, an inner-folding operation, and an outer-folding operation.

As shown in FIG. 1B, a distance between the first non-folding region NFA1 and the second non-folding region NFA2 may be substantially equal to the curvature diameter R1, but as shown in FIG. 1C, the distance between the first non-folding region NFA1 and the second non-folding region NFA2 may be smaller than the curvature diameter R1. FIGS. 1B and 1C are illustrated based on the display surface DS, and a case EDC (e.g., see FIG. 2A) forming an outer appearance of the electronic device ED may include end portions, which contact each other at end regions of the first and second non-folding regions NFA1 and NFA2.

Figure 2A:
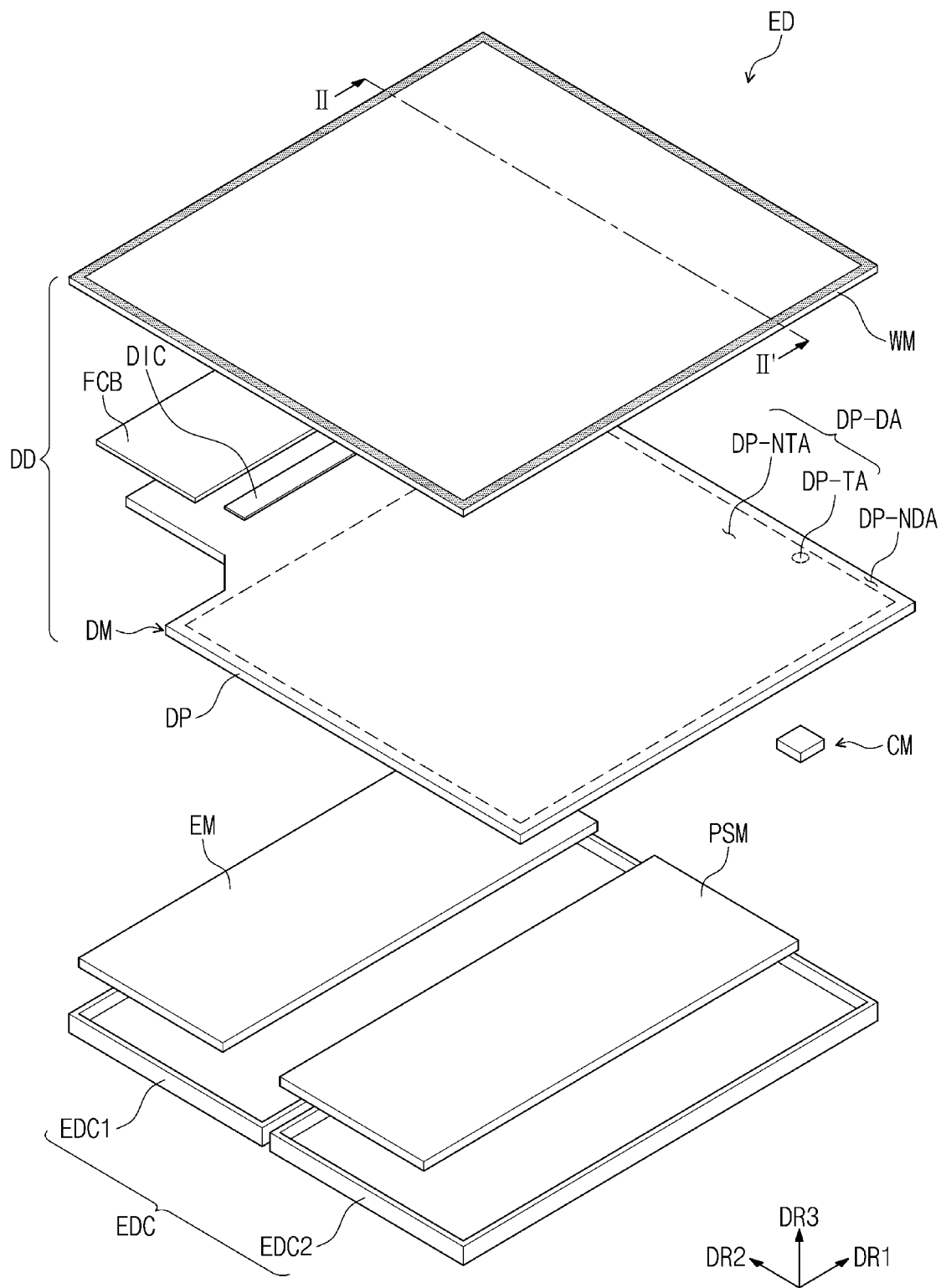
FIG. 2A is a schematic exploded perspective view illustrating an electronic device according to an embodiment of the disclosure.
Figure 2B:
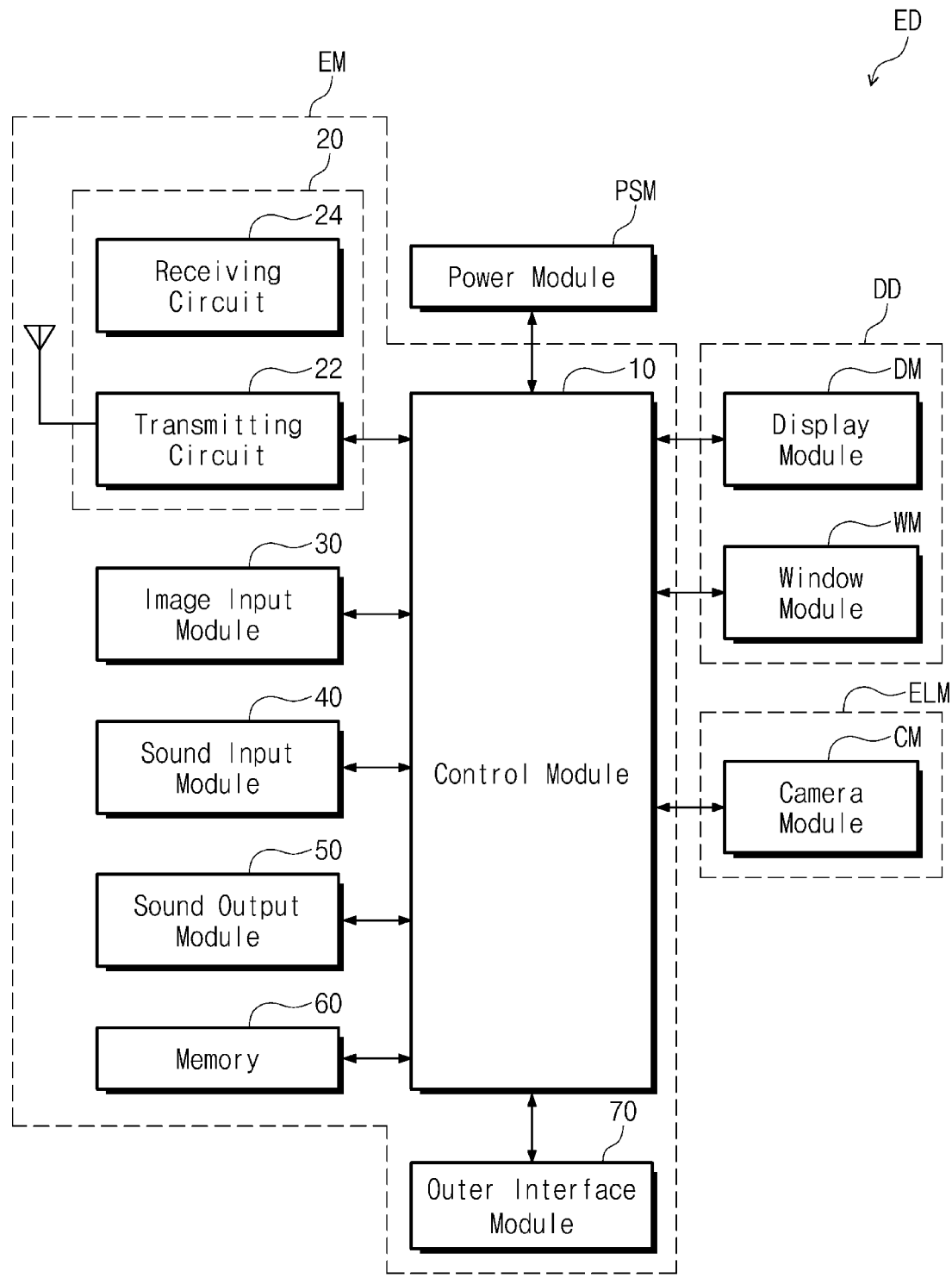
FIG. 2B is a schematic block diagram illustrating an electronic device according to an embodiment of the disclosure.

FIG. 2A is a schematic exploded perspective view illustrating the electronic device ED according to an embodiment. FIG. 2B is a schematic block diagram illustrating the electronic device ED according to an embodiment.

As shown in FIG. 2A, the electronic device ED may include a display device DD, an electronic module EM, a power module PSM, a camera module CM, and a case EDC. Although not shown in the drawings, the power module PSM may further include a mechanical structure that controls the folding operation of the display device DD.

The display device DD may be configured to produce or generate an image and to sense an external input. An example of the external input is an input provided from a user. The user's input may include various types of external inputs such as a part of the user's body, a pen, light, heat, or pressure. The display device DD may include a window module WM and a display module DM. The window module WM may serve as the front surface of the electronic device ED. The window module WM will be described in more detail below.

The display module DM may include a display panel DP. FIG. 2A shows an example in which the display panel DP is illustrated as the only element of the display module DM, but the display module DM may further include multiple elements disposed on or below the display panel DP. The stacking structure of the display module DM will be described in more detail below.

The display panel DP may include an active region DP-DA and a non-active region DP-NDA corresponding to the display region DA and the non-display region NDA of the electronic device ED (see FIG. 1A). In the specification, the phrase "a region or portion corresponds to another region or portion" will be used to mean that they are overlapped with (or overlap) each other in a given direction (e.g., in a plan view), but the two regions or portions may not have a same area.

The display module DM may include a driving chip DIC disposed on a non-display region DP-NDA. The display module DM may further include a flexible circuit film FCB coupled (or connected) to the non-display region DP-NDA. Although not shown in the drawings, the flexible circuit film FCB may be electrically connected to a main circuit board.

The active region DP-DA may include a first active region DP-TA and a second active region DP-NTA corresponding to the first display region TA and the second display region NTA of the display module DM.

The first active region DP-TA may have higher transmittance than the second active region DP-NTA and the non-active region DP-NDA.

The driving chip DIC may include driving elements (e.g., a data driving circuit) that drive pixels of the display panel DP. FIG. 2A illustrates an example in which the driving chip DIC is mounted on the display panel DP, but the disclosure is not limited to this example. For example, the driving chip DIC may be mounted on the flexible circuit film FCB.

The electronic module EM may include a control module 10, a wireless communication module 20, an image input module 30, a sound input module 40, a sound output module 50, a memory 60, and an outer interface module 70. The modules may be mounted on the circuit board or may be electrically connected to the circuit board through a flexible circuit board. The electronic module EM may be electrically connected to the power module PSM.

The control module 10 may be configured to control overall operations of the electronic device ED. For example, the control module 10 may activate or inactivate the display device DD, in accordance with a user's input. The control module 10 may control the image input module 30, the sound input module 40, and the sound output module 50, in accordance with a user's input. The control module 10 may include at least one microprocessor.

The wireless communication module 20 may be configured to transmit and receive a wireless signal to and from another terminal via a Bluetooth or a Wi-Fi line. The wireless communication module 20 may be configured to transmit and receive a voice signal via a typical communication line. The wireless communication module 20 may include a transmitting circuit 22, which is configured to modulate and transmit a signal to be transmitted, and a receiving circuit 24, which is configured to demodulate a received signal.

The image input module 30 may be configured to process an image signal and to convert it into image data that can be displayed on the display device DD. The sound input module 40 may be configured to receive an external sound signal through a microphone in a recording mode or in a voice recognition mode and to convert the sound signal into electrical voice data. The sound output module 50 may be configured to convert sound data, which is transmitted from the wireless communication module 20 or is stored in the memory 60, and to output the converted sound data to the outside.

The outer interface module 70 may serve (or function) as an interface that is electrically connected to an external charger, a wired/wireless data port, a card socket (e.g., a memory card or a subscriber identification module (SIM) or user identity module (UIM) card), and so forth.

The power module PSM may be configured to supply an electric power required for the overall operation of the electronic device ED. The power module PSM may include a typical battery device.

An electro-optical module ELM may be an electronic component that outputs or receives an optical signal. The electro-optical module ELM may transmit or receive the optical signal through the first display region TA (see FIG. 1A) and the first active region DP-TA. As an example, the electro-optical module ELM may include the camera module CM. The camera module CM may receive natural light through the first display region TA (see FIG. 1A) and the first active region DP-TA and capture an image of an external object by using the natural light.

However, the disclosure is not limited to this embodiment, and the electro-optical module ELM may include a proximity sensor or an infrared sensor.

The electro-optical module ELM may overlap (or may be overlapped with) the first display region TA (see FIG. 1A) and the first active region DP-TA. The electro-optical module ELM may be disposed in a lower region of the display module DM.

The case EDC may contain the display module DM, the electronic module EM, and the power module PSM. The case EDC is illustrated to include two separate cases EDC1 and EDC2, but the disclosure is not limited to this example. Although not shown in the drawings, the electronic device ED may further include a hinge structure, which is used to connect the two cases EDC1 and EDC2 to each other. The case EDC may be combined with the window module WM. The case EDC may protect the elements (e.g., the display module DM, the electronic module EM, and the power module PSM) contained in the case EDC.

Figure 3:
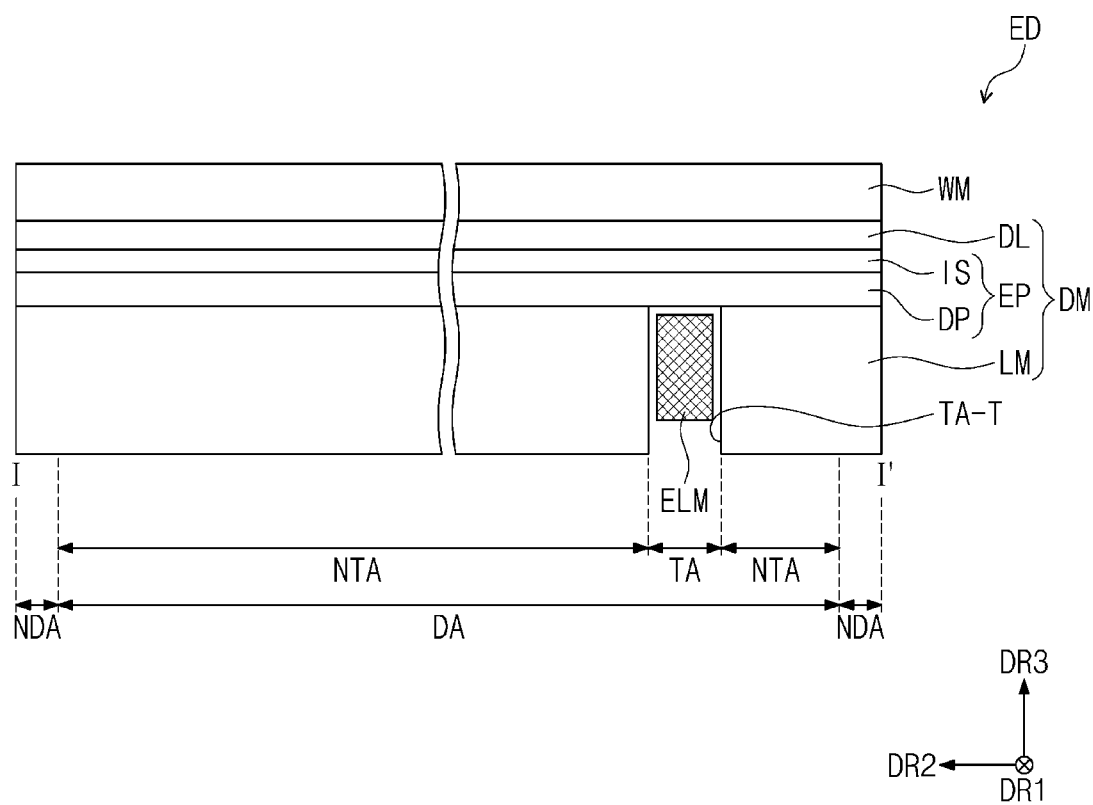
FIG. 3 is a schematic cross-sectional view illustrating an electronic device according to an embodiment of the disclosure.

FIG. 3 is a schematic cross-sectional view illustrating the electronic device ED according to an embodiment of the disclosure. In detail, FIG. 3 is a schematic cross-sectional view taken along line I-I' of FIG. 1A.

Referring to FIG. 3, the electronic device ED may include the window module WM, the display module DM disposed below the window module WM, and the electro-optical module ELM. The display module DM may include the display panel DP, an input sensor IS disposed on the display panel DP, a damping layer DL disposed on the input sensor IS, and a lower member LM disposed below the display panel DP. In an embodiment, an adhesive layer may be disposed between adjacent ones of the elements.

The display panel DP may be one of light-emitting type display panels (e.g., an organic light-emitting display panel or a quantum dot light-emitting display panel), but the disclosure is not limited to a specific kind of display panel.

The input sensor IS may include sensing electrodes (not shown) that sense an external input, trace lines (not shown) electrically connected to the sensing electrodes, and an inorganic and/or organic layer that protects the sensing electrodes or the trace lines or prevents an electric short issue between the sensing electrodes or the trace lines. The input sensor IS may be a capacitance-sensing-type sensor, but the disclosure is not limited to this example.

The input sensor IS may be directly formed on an encapsulation layer of the display panel DP in a successive manner, during a fabrication process. In the specification, the display panel DP with the input sensor IS will be referred to as an electronic panel EP. However, the disclosure is not limited to the above example, and in an embodiment, the input sensor IS may be fabricated as a panel distinct from the display panel DP and may be attached to the display panel DP by an adhesive layer.

In an embodiment, a penetration hole TA-T may be formed in a region of the electronic device ED. The penetration hole TA-T may be formed in the lower member LM, not in the display panel DP.

The penetration hole TA-T may be formed by stacking the elements shown in FIG. 3 and patterning the elements or may be formed by stacking elements with holes.

A region of the display device DD, in which the penetration hole TA-T is formed, may be defined as the first display region TA. The penetration hole TA-T in the first display region TA may be used to emit or receive an optical signal or to display an image, if desired.

The electro-optical module ELM may be disposed in the penetration hole TA-T. For example, the electro-optical module ELM may be overlapped with the first display region TA.

The damping layer DL may be disposed on the display panel DP. In detail, the damping layer DL may be disposed on the electronic panel EP. The damping layer DL may have a multi-layered structure or a single-layered structure.

The damping layer DL may be formed of or include polymer. For example, the damping layer DL may be formed of or include at least one of polyimide, polycarbonate, polyamide, triacetylcellulose, polymethylmethacrylate, and polyethylene terephthalate. For example, the damping layer DL may be formed of or include polyethylene terephthalate. However, the disclosure is not limited to this example.

A modulus of the damping layer DL may have a value that is smaller than or equal to a modulus of a window protection layer PF of the window module WM which will be described below. Since the damping layer DL includes polymer and has a modulus smaller than or equal to that of the window protection layer PF, the damping layer DL may have a good flexibility property.

The damping layer DL may absorb an external impact exerted on the front surface of the electronic device ED. In detail, the damping layer DL may be used to prevent the display panel DP from being deformed. For example, the damping layer DL may allow the display panel DP to have a high resistant property to a pressure by a fingernail or an impact caused by a pen or the like. Accordingly, it may be possible to prevent a failure or defect, such as a white spot issue, from occurring in the display panel DP. In addition, it may be possible to prevent a portion of the electronic panel EP that is overlapped with the penetration hole TA-T, from hanging down by an external impact.

The following Table 1 summarizes mechanical properties of an electronic device including a damping layer (Embodiment 1) and an electronic device without a damping layer (Comparative example 1).

The item "fingernail pressure" in Table 1 represents a force (kgf) corresponding to the largest value of a fingernail pressure which does not result in an imprinting failure in case that a pressure by a fingernail is exerted on the electronic device.

The item "pen-impact resistance" in Table 1 represents the greatest height of a pen which does not result in a failure in case that a pen is dropped on a top surface of an electronic device.

TABLE 1

| Evaluation Items | Embodiment 1 | | Comparative example 1 | |
| --- | --- | --- | --- | --- |
| | Non-Folding Region | Folding Region | Non-Folding Region | Folding Region |
| Fingernail Pressure (kgf) | 12 | 7 | 12 | 3 |
| Pen-Impact Resistance (cm) | 6 | 4 | 5 | 3 |

Table 1 shows that the electronic device according to Embodiment 1 was desirable in terms of resistance to the fingernail pressure and the pen impact-resistant property, compared with Comparative Example 1. Especially, the resistant property to the fingernail pressure at the folding region of Embodiment 1 was better than twice that at the folding region of Comparative Example 1. The pen impact-resistant property in Embodiment 1 was better than that in Comparative Example 1, in both of the non-folding and folding regions. This shows that, in case that a damping layer including polymer is provided, the electronic device can have an improved impact-resistant property. Especially, the electronic device can have desirable durability, even in case that there is a pressure exerted from a fingernail or an impact caused by a pen. In an embodiment, a thickness of the damping layer DL in the third direction DR3 may range from about 5 μm to about 30 μm. For example, the thickness of the damping layer DL may range from about 5 μm to about 25 μm (for example, from about 10 μm to about 23 μm). In case that the thickness of the damping layer DL has the afore-described range, the folding operation of the electronic device ED at low temperatures may be more readily performed. This will be described in more detail below.

The lower member LM may include various functional members. For example, the lower member LM may include a light-blocking layer preventing light from being incident on the display panel DP, an impact absorption layer absorbing an external impact, a support layer supporting the display panel DP, a heat-dissipation layer dissipating heat produced from the display panel DP, and/or a digitizer sensing an external input. The disclosure is not limited to a specific stacking structure of the lower member LM.

Figure 4A:
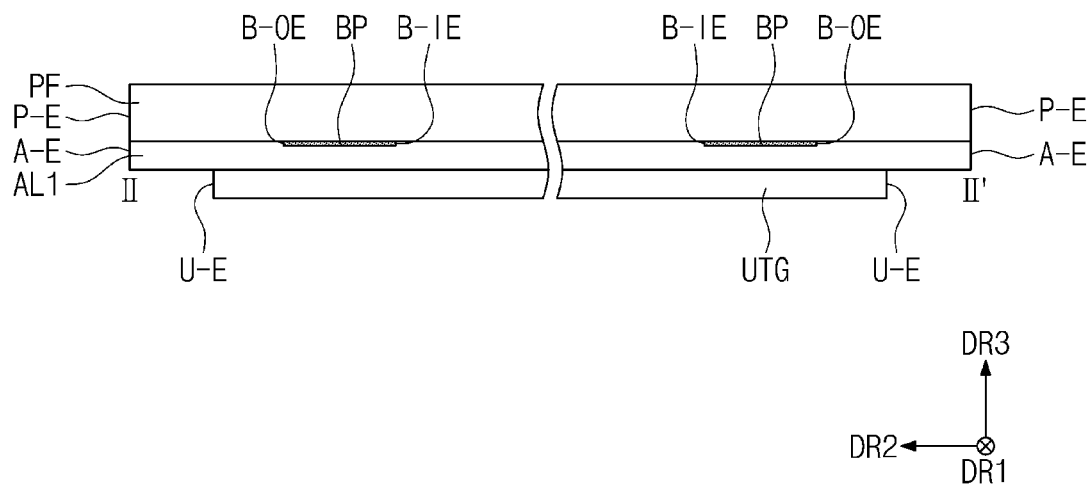
FIGS. 4A and 4B are cross-sectional views illustrating a window module according to an embodiment of the disclosure.
Figure 4B:
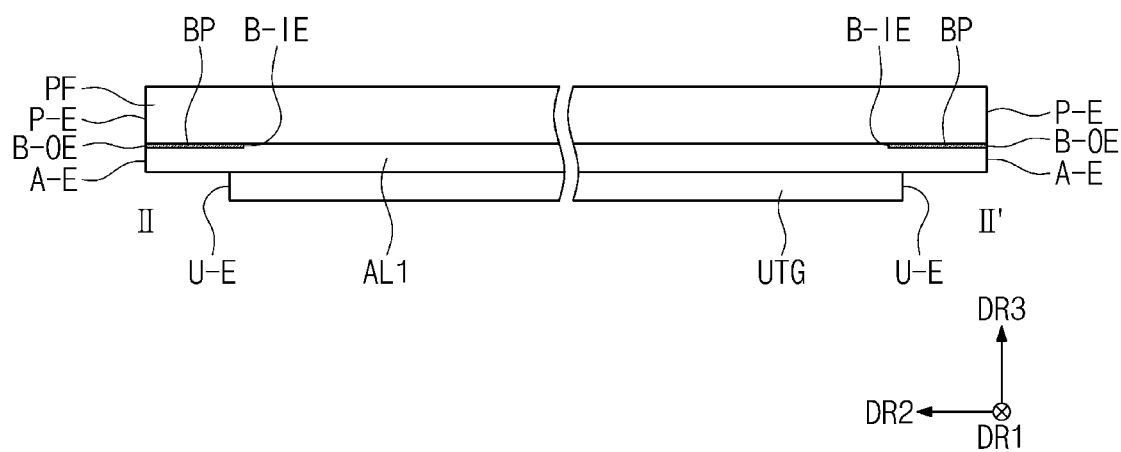

FIGS. 4A and 4B are schematic cross-sectional views illustrating the window module WM according to an embodiment of the disclosure.

Referring to FIGS. 4A and 4B, the window module WM may include a thin glass substrate UTG, the window protection layer PF disposed on the thin glass substrate UTG, and a bezel pattern BP disposed on a bottom surface of the window protection layer PF. In the embodiment, the window protection layer PF may include a plastic film. Accordingly, the window module WM may further include an adhesive layer AL1 (hereinafter referred to as a first adhesive layer) that attaches the window protection layer PF to the thin glass substrate UTG.

The bezel pattern BP may be overlapped with the non-display region NDA shown in FIG. 1A. The bezel pattern BP may be disposed on a surface of the thin glass substrate UTG or a surface of the window protection layer PF. FIG. 4A illustrates an example in which the bezel pattern BP is disposed on a bottom surface of the window protection layer PF. However, the disclosure is not limited to this example, and in an embodiment, the bezel pattern BP may be disposed on a top surface of the window protection layer PF. The bezel pattern BP may be a colored light-blocking layer that is formed by, for example, a coating method. The bezel pattern BP may include a base material and dye or pigment that is mixed in the base material.

In a plan view, the bezel pattern BP may correspond to the non-display region NDA shown in FIG. 1A. The bezel pattern BP may have a closed loop shape, in a plan view. A region, which is located inside an inner edge B-IE of the bezel pattern BP, may correspond to the second display region NTA shown in FIG. 1A.

A thickness of the thin glass substrate UTG may range from about 15 μm to about 45 μm. The thin glass substrate UTG may be a chemically strengthened glass. By using the thin glass substrate UTG, it may be possible to suppress occurrence of a crease, even in case that the folding and unfolding operations are repeatedly performed.

A thickness of the window protection layer PF may range from about 50 μm to about 80 μm. The window protection layer PF may be formed of or include at least one of polyimide, polycarbonate, polyamide, triacetylcellulose, polymethylmethacrylate, and polyethylene terephthalate. Although not shown in the drawings, at least one of a hard coating layer and an anti-fingerprint layer may be disposed on the top surface of the window protection layer PF. A modulus of the damping layer DL may be equal to or smaller than a modulus of the window protection layer PF.

The first adhesive layer AL1 may be a pressure sensitive adhesive (PSA) film or an optically clear adhesive (OCA) film. In an embodiment, the first adhesive layer AL1 may include at least one of typical adhesive agents. Other adhesive layers to be described below may have substantially identical or similar features to the first adhesive layer AL1.

The first adhesive layer AL1 may be detached from the thin glass substrate UTG. Since the window protection layer PF has a mechanical strength smaller than the thin glass substrate UTG, a scratch may easily occur on the window protection layer PF. In such a case, the first adhesive layer AL1 and the window protection layer PF may be detached from the thin glass substrate UTG, and a new window protection layer PF may be attached to the thin glass substrate UTG.

In a plan view, an edge U-E of the thin glass substrate UTG may not be overlapped with the bezel pattern BP. For example, the edge U-E of the thin glass substrate UTG may be exposed from (or not overlapped with) the bezel pattern BP, and thus, it may be possible to examine whether the edge U-E of the thin glass substrate UTG has a fine crack with an inspection apparatus.

In a plan view, the edge U-E of the thin glass substrate UTG may be located between an edge P-E of the window protection layer PF and an outer edge B-OE of the bezel pattern BP. The edge U-E of the thin glass substrate UTG may be sufficiently exposed from the bezel pattern BP.

In a plan view, the edge P-E of the window protection layer PF may be aligned with an edge A-E of the first adhesive layer AL1. The window protection layer PF and the first adhesive layer AL1 may have a same area and a same shape.

In an embodiment, referring to FIG. 4B, the outer edge B-OE of the bezel pattern BP may be aligned with the edge P-E of the window protection layer PF, in a plan view.

In an embodiment, the window protection layer PF may include a plastic resin layer disposed directly on a top surface of the thin glass substrate UTG. An insert molding method may be used to form the plastic resin layer that contacts the top surface of the thin glass substrate UTG. Before the formation of the plastic resin layer, the bezel pattern BP may be formed on the top surface of the thin glass substrate UTG. Thus, the plastic resin layer may cover (or overlap) the bezel pattern BP.

Figure 5:
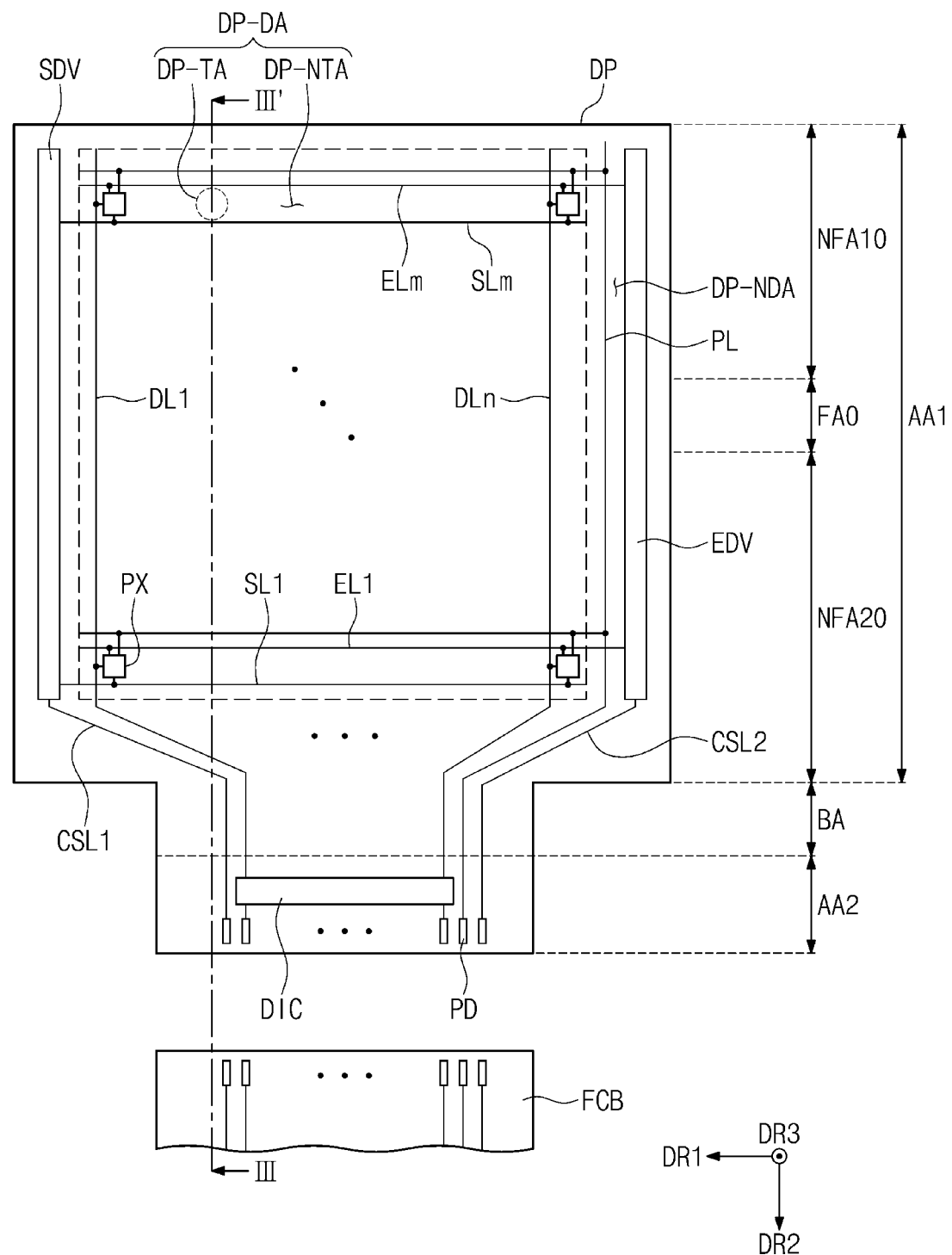
FIG. 5 is a schematic plan view illustrating a display panel according to an embodiment of the disclosure.

FIG. 5 is a schematic plan view illustrating the display panel DP according to an embodiment of the disclosure.

Referring to FIG. 5, the display panel DP may include the active region DP-DA and the non-active region DP-NDA.

The active region DP-DA and the non-active region DP-NDA may be distinguishable from each other, based on whether a pixel PX is disposed therein or not.

The pixel PX may be disposed in the active region DP-DA, and a scan driving portion SDV, a data driving portion, and an emission driving portion EDV may be disposed in the non-active region DP-NDA. In an embodiment, the data driving portion may be a part of the driving chip DIC.

The active region DP-DA may include the first active region DP-TA and the second active region DP-NTA, and the first active region DP-TA may be a region whose resolution is lower than that of the second active region DP-NTA. For example, in case that four pixels per unit area are disposed in the second active region DP-NTA, two pixels per unit area may be disposed in the first active region DP-TA. A portion of the first active region DP-TA, in which the pixel is not disposed, may be used as a transmission path of an optical signal.

The display panel DP may include a first region AA1, a second region AA2, and a bending region BA, which are distinct from each other in the second direction DR2. The second region AA2 and the bending region BA may be a portion of the non-active region DP-NDA. The bending region BA may be disposed between the first and second regions AA1 and AA2.

FIG. 5 illustrates the display panel DP in an unfolded state. In case that the display panel DP is provided in the electronic device ED, the first and second regions AA1 and AA2 of the display panel DP may be placed on different planes from each other, in case that the electronic device ED is in the unfolded state as shown in FIG. 1A. This will be described in more detail with reference to FIGS. 7A and 7B.

The first region AA1 may be a region corresponding to the display surface DS of FIG. 1A. The first region AA1 may include a first non-folding region NFA10, a second non-folding region NFA20, and a folding region FA0. The first non-folding region NFA10, the second non-folding region NFA20, and the folding region FA0 may correspond to the first non-folding region NFA1, the second non-folding region NFA2, and the folding region FA of FIGS. 1A to 1C, respectively.

The display panel DP may include pixels PX, scan lines SL1 to SLm, data lines DL1 to DLn, emission lines EL1 to ELm, first and second control lines CSL1 and CSL2, a power line PL, and pads PD, where each of m and n is a natural number.

The pixels PX may be electrically connected to the scan lines SL1 to SLm, the data lines DL1 to DLn, and the emission lines EL1 to ELm.

The scan lines SL1 to SLm may be extended in the second direction DR2 and may be electrically connected to the scan driving portion SDV. The data lines DL1 to DLn may be extended in the second direction DR2 and may be electrically connected to the driving chip DIC via the bending region BA. The emission lines EL1 to ELm may be extended in the first direction DR1 and may be electrically connected to the emission driving portion EDV.

The power line PL may include a portion that is extended in the second direction DR2, and a portion that is extended in the first direction DR1. The portion extended in the first direction DR1 and the portion extended in the second direction DR2 may be disposed on different layers from each other. A portion of the power line PL extending in the second direction DR2 may be extended to the second region AA2 via the bending region BA. The power line PL may be used to provide a first voltage to the pixels PX.

The first control line CSL1 may be electrically connected to the scan driving portion SDV and may be extended toward a bottom end of the second region AA2 via the bending region BA. The second control line CSL2 may be electrically connected to the emission driving portion EDV and may be extended toward the bottom end of the second region AA2 via the bending region BA.

In a plan view, the pads PD may be disposed adjacent to the bottom end of the second region AA2. The driving chip DIC, the power line PL, the first control line CSL1, and the second control line CSL2 may be electrically connected to the pads PD. The flexible circuit film FCB may be electrically connected to the pads PD through an anisotropic conductive adhesive layer.

Figure 6A:
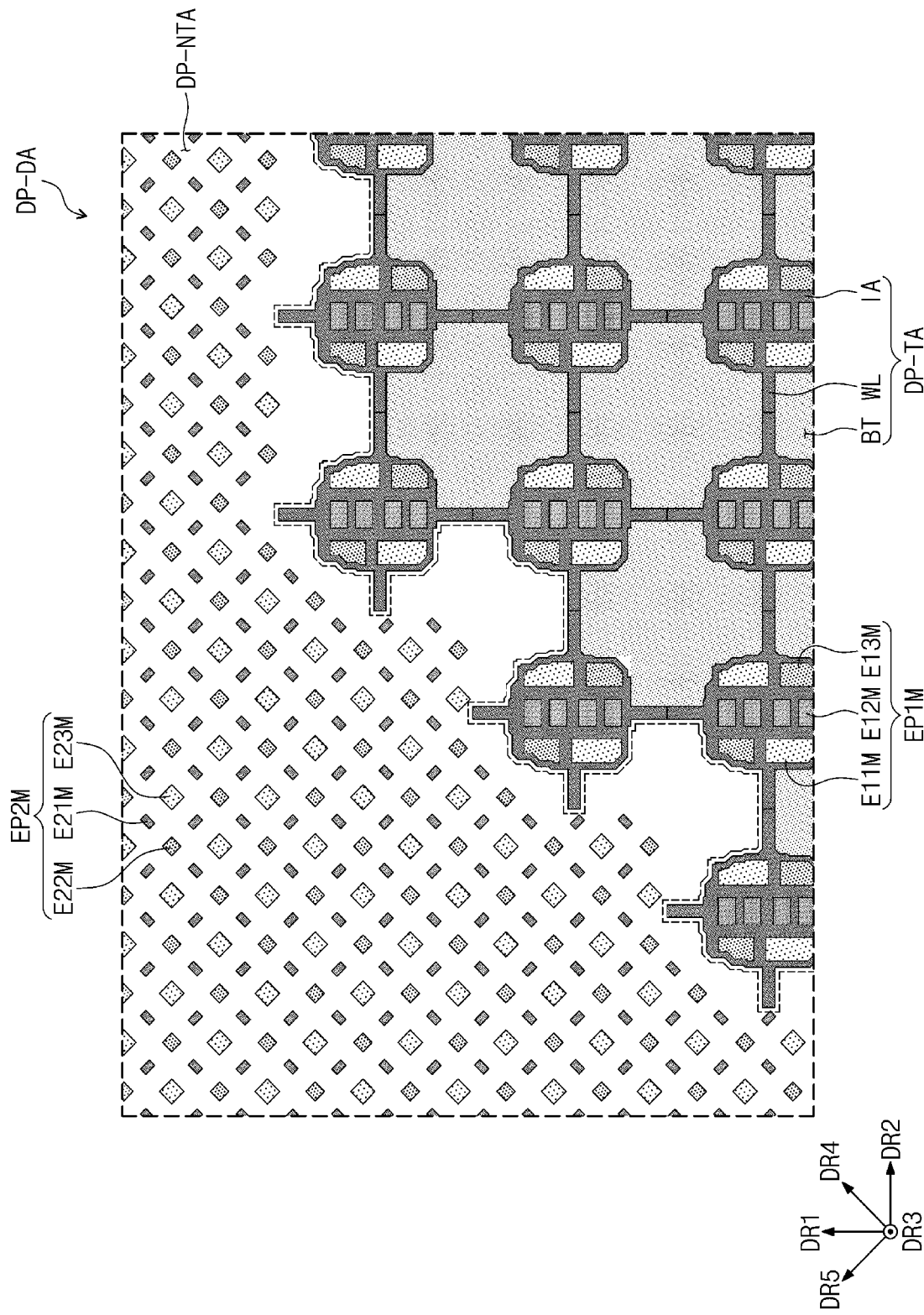
FIG. 6A is a schematic plan view illustrating a display panel according to an embodiment of the disclosure.

FIG. 6A is a schematic plan view illustrating the display panel DP according to an embodiment of the disclosure.

Referring to FIG. 6A, the active region DP-DA may include a first pixel EP1M, which is disposed in the first active region DP-TA, and a second pixel EP2M, which is disposed in the second active region DP-NTA. The first pixel EP1M and the second pixel EP2M may have light-emitting areas different from each other and may be arranged in different shapes or forms. The first pixels EP1M may be provided in the first active region DP-TA and may be arranged to be spaced apart from each other in the first and second directions DR1 and DR2.

Each of the first pixels EP1M may include sub-pixels E11M, E12M, and E13M.

(1-1)-th sub-pixels E11M may be spaced apart from each other in the second direction DR2 with (1-2)-th sub-pixels E12M interposed therebetween, and a pair of the (1-1)-th sub-pixels E11M, which are spaced apart from each other, may be arranged in a diagonal direction, for example, a fourth direction DR4. In the embodiment, the (1-1)-th sub-pixels E11M may be configured to emit red light.

The (1-2)-th sub-pixels E12M may be disposed between the (1-1)-th sub-pixels E11M and (1-3)-th sub-pixels E13M. In the embodiment, each of the first pixels EP1M may include four (1-2)-th sub-pixels E12M which are arranged in the first direction DR1 to be spaced apart from each other. In the embodiment, the (1-2)-th sub-pixels E12M may be configured to emit green light.

The (1-3)-th sub-pixels E13M may be spaced apart from each other in the second direction DR2 with the (1-2)-th sub-pixels E12M interposed therebetween, and a pair of the (1-3)-th sub-pixels E13M, which are spaced apart from each other, may be arranged in a diagonal direction, for example, a fifth direction DR5. In the embodiment, the (1-3)-th sub-pixels E13M may be configured to emit blue light.

Light-emitting areas of the sub-pixels E11M, E12M, and E13M may be increased in the order of the (1-2)-th sub-pixel E12M, the (1-3)-th sub-pixel E13M, and the (1-1)-th sub-pixel E11M. For example, the light-emitting area of the (1-2)-th sub-pixel E12M may be smaller than that of the (1-3)-th sub-pixel E13M, and the light-emitting area of the (1-3)-th sub-pixel E13M may be smaller than that of the (1-1)-th sub-pixel E11M.

Each of the second pixels EP2M may include sub-pixels E21M, E22M, and E23M. The second pixels EP2M may be arranged to be spaced apart from each other in the first and second directions DR1 and DR2.

In the embodiment, the sub-pixels E21M, E22M, and E23M, which are disposed in the second active region DP-NTA, may be arranged to form a PENTILE™ structure.

A (2-2)-th sub-pixel E22M may be spaced apart from a (2-1)-th sub-pixel E21M in the fourth direction DR4, and a (2-3)-th sub-pixel E23M may be spaced apart from the (2-1)-th sub-pixel E21M in the fifth direction DR5. The (2-3)-th sub-pixel E23M may be spaced apart from the (2-2)-th sub-pixel E22M in the second direction DR2.

The (2-1)-th sub-pixel E21M may have a rectangular shape whose sides are parallel to the fourth and fifth directions DR4 and DR5. In the embodiment, the (2-1)-th sub-pixel E21M may be configured to emit green light. The (2-1)-th sub-pixel E21M may have a diamond shape or rhombic shape.

The (2-2)-th sub-pixel E22M may have a square shape whose sides are parallel to the fourth and fifth directions DR4 and DR5. In the embodiment, the (2-2)-th sub-pixel E22M may be configured to emit blue light. The (2-2)-th sub-pixel E22M may have a diamond shape or rhombic shape.

The (2-3)-th sub-pixel E23M may have a square shape whose sides are parallel to the fourth and fifth directions DR4 and DR5. In the embodiment, the (2-3)-th sub-pixel E23M may be configured to emit red light. The (2-3)-th sub-pixel E23M may have a diamond or rhombic shape.

Light-emitting areas of the sub-pixels E21M, E22M, and E23M may be increased in the order of the (2-1)-th sub-pixel E21M, the (2-2)-th sub-pixel E22M, and the (2-3)-th sub-pixel E23M. For example, the light-emitting area of the (2-1)-th sub-pixel E21M may be smaller than that of the (2-2)-th sub-pixel E22M, and the light-emitting area of the (2-2)-th sub-pixel E22M may be smaller than that of the (2-3)-th sub-pixel E23M.

The first active region DP-TA may include an image region IA, a wiring region WL, and a transmission region BT. The image region IA and the wiring region WL may be regions that are formed by patterning conductive materials forming (or constituting) the pixel PX. The transmission region BT may be a region, through which light to be emitted from or received by the electro-optical module ELM passes. To prevent light propagating through the transmission region BT from being reflected by the conductive materials, a light-blocking material may be further provided in the image region IA and the wiring region WL.

Figure 6B:
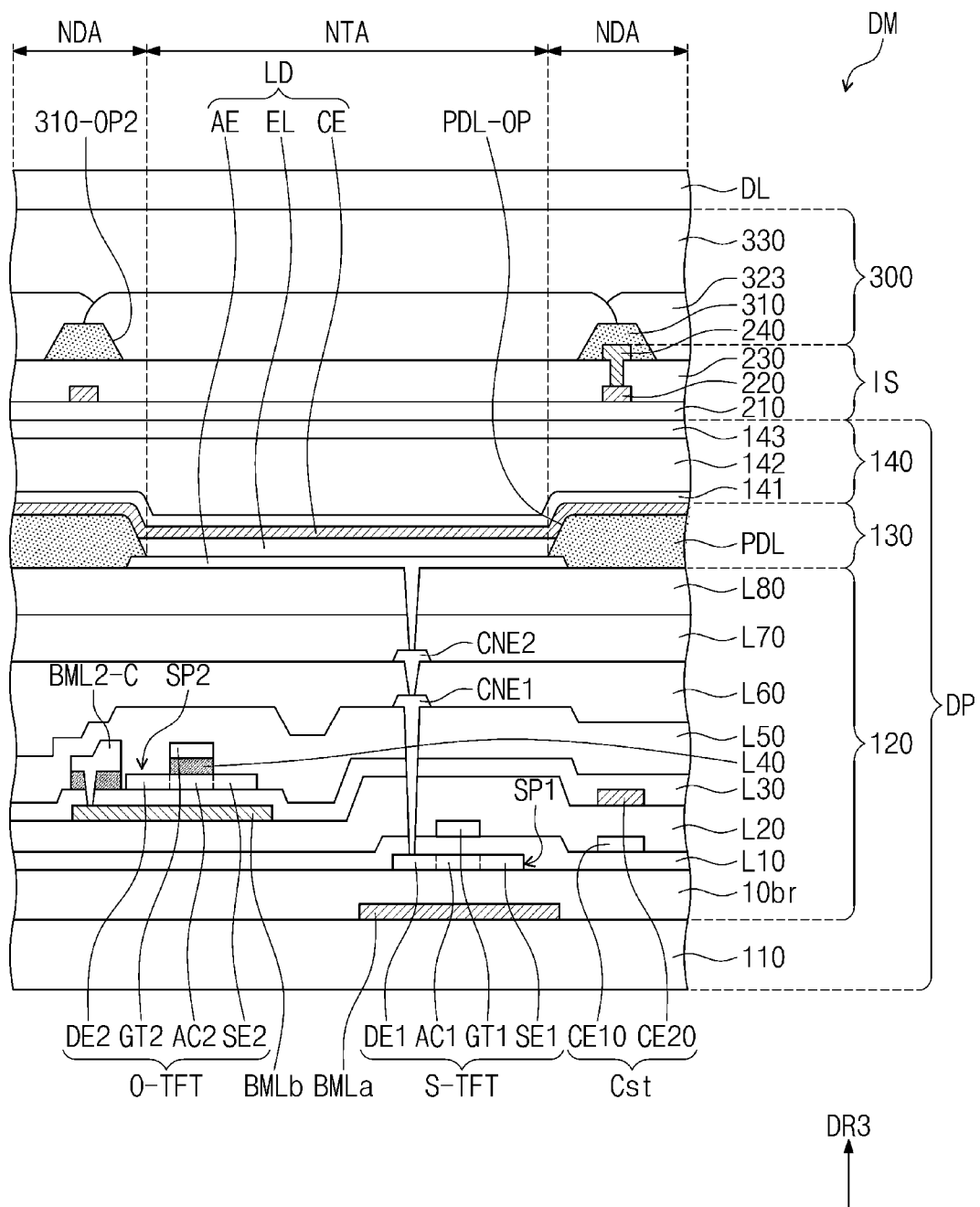
FIG. 6B is a cross-sectional view illustrating a display module according to an embodiment of the disclosure.

FIG. 6B is a schematic cross-sectional view illustrating the display module DM according to an embodiment.

FIG. 6B illustrates only some of elements forming (or constituting) the display module DM. In an embodiment, the display module DM may include the display panel DP, the input sensor IS disposed on the display panel DP, a color filter layer 300 disposed on the input sensor IS, and the damping layer DL disposed on the color filter layer 300.

The display panel DP may include a base layer 110, a circuit layer 120, a light-emitting device layer 130, and an encapsulation layer 140.

The base layer 110 may be an element providing a base surface, on which the circuit layer 120 will be disposed. The base layer 110 may be a rigid substrate or a flexible substrate which can be bent, folded, or rolled. The base layer 110 may be a glass substrate, a metal substrate, a polymer substrate, or the like.

The circuit layer 120 may be disposed on the base layer 110. The circuit layer 120 may include an insulating layer, a semiconductor pattern, a conductive pattern, a signal line, and so forth.

In detail, the circuit layer 120 may include a buffer layer 10br, first to eighth insulating layers L10 to L80, and a semiconductor material, which are disposed on the base layer 110.

A first semiconductor pattern SP1 may be disposed on the buffer layer 10br.

A source region SE1, an active region AC1, and a drain region DE1 of a silicon transistor S-TFT may be regions of the first semiconductor pattern SP1.

The first insulating layer L10 may be disposed on the buffer layer 10br. The first insulating layer L10 may be overlapped in common with pixels and may cover (or overlap) the first semiconductor pattern SP1. The first insulating layer L10 may be an inorganic layer and/or an organic layer and may have a single- or multi-layered structure. The first insulating layer L10 may be formed of or include at least one of aluminum oxide, titanium oxide, silicon oxide, silicon nitride, silicon oxynitride, zirconium oxide, and hafnium oxide. In the embodiment, the first insulating layer L10 may be a silicon oxide layer of a single-layered structure. The first insulating layer L10 as well as insulating layers of the circuit layer 120 to be described below may be an inorganic layer and/or an organic layer and may have a single- or multi-layered structure. The inorganic layer may be formed of or include at least one of the afore-described materials, but the disclosure is not limited to this example.

A gate GT1 of the silicon transistor S-TFT may be disposed on the first insulating layer L10.

The second insulating layer L20 may be disposed on the first insulating layer L10 to cover (or overlap) the gate GT1. The third insulating layer L30 may be disposed on the second insulating layer L20. A second electrode CE20 of a storage capacitor Cst may be disposed between the second insulating layer L20 and the third insulating layer L30. A first electrode CE10 of the storage capacitor Cst may be disposed between the first insulating layer L10 and the second insulating layer L20.

A second semiconductor pattern SP2 may be disposed on the third insulating layer L30. The second semiconductor pattern SP2 may include an active region AC2 of an oxide transistor O-TFT, which will be described below. The second semiconductor pattern SP2 may be formed of or include at least one of oxide semiconductor materials. The second semiconductor pattern SP2 may be formed of or include a transparent conductive oxide (TCO) (e.g., indium tin oxide (ITO), indium zinc oxide (IZO), indium gallium zinc oxide (IGZO), zinc oxide (ZnO), or indium oxide ($In_2O_3$)).

A source region SE2, an active region AC2, and a drain region DE2 of the oxide transistor O-TFT may be formed from the second semiconductor pattern SP2.

The fourth insulating layer L40 may be disposed on the third insulating layer L30. In an embodiment, the fourth insulating layer L40 may be an insulating pattern, which is overlapped with a gate GT2 of the oxide transistor O-TFT and exposes the source region SE2 and the drain region DE2 of the oxide transistor O-TFT.

The gate GT2 of the oxide transistor O-TFT may be disposed on the fourth insulating layer L40. The gate GT2 of the oxide transistor O-TFT may be a region of a metal pattern. The gate GT2 of the oxide transistor O-TFT may be overlapped with the active region AC2.

The fifth insulating layer L50 may be disposed on the fourth insulating layer L40 to cover the gate GT2. A first connection electrode CNE1 may be disposed on the fifth insulating layer L50. The first connection electrode CNE1 may be electrically connected to the drain region DE1 of the silicon transistor S-TFT through a contact hole penetrating the first to fifth insulating layers L10, L20, L30, L40, and L50.

The sixth insulating layer L60 may be disposed on the fifth insulating layer L50. A second connection electrode CNE2 may be disposed on the sixth insulating layer L60. The second connection electrode CNE2 may be electrically connected to the first connection electrode CNE1 through the contact hole penetrating the sixth insulating layer L60. The seventh insulating layer L70 may be disposed on the sixth insulating layer L60 to cover the second connection electrode CNE2. The eighth insulating layer L80 may be disposed on the seventh insulating layer L70.

Each of the sixth insulating layer L60, the seventh insulating layer L70, and the eighth insulating layer L80 may be an organic layer. For example, each of the sixth insulating layer L60, the seventh insulating layer L70, and the eighth insulating layer L80 may be formed of or include at least one of general-purpose polymers (e.g., benzocyclobutene (BCB), polyimide, hexamethyldisiloxane (HMDSO), polymethylmethacrylate (PMMA), or polystyrene (PS)), polymer derivatives having a phenol-based group, acryl-based polymers, imide-based polymers, arylether-based polymers, amide-based polymers, fluorine-based polymers, p-xylene-based polymers, vinylalcohol-based polymers, and blends thereof.

A first back-side metal layer BMLa may be disposed between the base layer 110 and the buffer layer 10br. The first back-side metal layer BMLa may be disposed below the silicon transistor S-TFT to prevent light from being incident on a bottom surface of the silicon transistor S-TFT.

A second back-side metal layer BMLb may be disposed between the second insulating layer L20 and the third insulating layer L30. The second back-side metal layer BMLb may be disposed below the oxide transistor O-TFT. The second back-side metal layer BMLb may prevent light from being incident on a bottom surface of the oxide transistor O-TFT. The second back-side metal layer BMLb may be connected to a contact electrode BML2-C, and may receive a constant voltage or a signal from the contact electrode BML2-C. The contact electrode BML2-C may be located at the same level as that of the gate GT2 of the oxide transistor O-TFT.

Each of the first back-side metal layer BMLa and the second back-side metal layer BMLb may be formed of or include at least one reflective metallic material. For example, each of the first back-side metal layer BMLa and the second back-side metal layer BMLb may be formed of or include at least one of silver (Ag), silver-containing alloys, molybdenum (Mo), molybdenum-containing alloys, aluminum (Al), aluminum-containing alloys, aluminum nitride (AlN), tungsten (W), tungsten nitride (WN), copper (Cu), and doped amorphous silicon.

The light-emitting device layer 130 may be disposed on the circuit layer 120. The light-emitting device layer 130 may include an emission element LD. For example, the emission element LD may include an organic light-emitting material, an inorganic light-emitting material, organic-inorganic light-emitting material, quantum dots, quantum rods, micro-LEDs, or nano-LEDs.

The emission element LD may include a first electrode (or pixel electrode) AE, an emission layer EL, and a second electrode (or common electrode) CE.

The first electrode AE may be disposed on the eighth insulating layer L80. The first electrode AE may be a (semi) transparent electrode or a reflective electrode. In an embodiment, the first electrode AE of the emission element LD may include a reflection layer which is formed of Ag, Mg, Al, Pt, Pd, Au, Ni, Nd, Ir, Cr, or compounds thereof, and a transparent or semitransparent electrode layer which is formed on the reflection layer. In an embodiment, the transparent or semitransparent electrode layer may be formed of or include at least one material selected from the group including (or consisting of) indium tin oxide (ITO), indium zinc oxide (IZO), indium gallium zinc oxide (IGZO), zinc oxide (ZnO) or indium oxide ($In_2O_3$), and aluminum-doped zinc oxide (AZO). For example, the first electrode AE of the emission element LD may have a structure, in which ITO, Ag, and ITO layers are stacked.

A pixel definition layer PDL may be disposed on the eighth insulating layer L80. The pixel definition layer PDL may be configured to have a light-blocking property.

Although not shown in the drawings, a hole control layer may be disposed between the first electrode AE and the emission layer EL. The hole control layer may include a hole transport layer and may further include a hole injection layer. An electron control layer may be disposed between the emission layer EL and the second electrode CE. The electron control layer may include an electron transport layer and may further include an electron injection layer.

The encapsulation layer 140 may be disposed on the light-emitting device layer 130. The encapsulation layer 140 may include an inorganic layer 141, an organic layer 142, and an inorganic layer 143 which are sequentially stacked, but the layers constituting the encapsulation layer 140 are not limited to this example. The encapsulation layer 140 may protect the light-emitting device layer 130 from a contamination material or foreign substances (e.g., moisture, oxygen, and dust particles).

The input sensor IS may be disposed on the display panel DP. The input sensor IS may be formed on the display panel DP in a successive manner. In this case, the input sensor IS may be disposed directly on the display panel DP. The expression "the input sensor IS is disposed directly on the display panel DP" means that an additional element is not disposed between the input sensor IS and the display panel DP.

The input sensor IS may include a base layer 210, a first conductive layer 220, a sensing insulating layer 230, and a second conductive layer 240.

The base layer 210 may be disposed directly on the display panel DP. The base layer 210 may be an inorganic layer containing at least one of silicon nitride, silicon oxynitride, and silicon oxide. As another example, the base layer 210 may be an organic layer containing at least one of epoxy resins, acrylic resins, and imide-based resins.

The first conductive layer 220 and the second conductive layer 240 may include conductive lines that define a mesh-shaped sensing electrode. The conductive lines may not be overlapped with a first opening PDL-OP and may be overlapped with the pixel definition layer PDL.

The first and second conductive layers 220 and 240 may include a metal layer or a transparent conductive layer.

The metal layer may have a single-layered structure and may be formed of or include at least one of molybdenum, silver, titanium, copper, aluminum, and alloys thereof. The transparent conductive layer may include transparent conductive oxide such as indium tin oxide (ITO), indium zinc oxide (IZO), zinc oxide (ZnO), or indium zinc tin oxide (IZTO). In an embodiment, the transparent conductive layer may include a conductive polymer (e.g., poly(3,4-ethylene-dioxythiophene) (PEDOT)), metal nanowires, or graphene.

The conductive layer may have a multi-layered structure including metal layers. The metal layers may have a triple-layered structure including, for example, titanium/aluminum/titanium layers. The conductive layer of the multi-layered structure may include at least one metal layer and at least one transparent conductive layer.

The sensing insulating layer 230 may be disposed between the first conductive layer 220 and the second conductive layer 240. The sensing insulating layer 230 may include an inorganic layer. The inorganic layer may be formed of or include at least one of aluminum oxide, titanium oxide, silicon oxide, silicon nitride, silicon oxynitride, zirconium oxide, and hafnium oxide.

As another example, the sensing insulating layer 230 may include an organic layer. The organic layer may be formed of or include at least one of acryl-based resins, methacrylate-based resins, polyisoprene-based resins, vinyl-based resins, epoxy-based resins, urethane-based resins, cellulose-based resins, siloxane-based resins, polyimide-based resins, polyamide-based resins, and perylene-based resins.

The color filter layer 300 may be disposed on the input sensor IS. The color filter layer 300 may include a division pattern 310, a color filter pattern 323, and a planarization layer 330.

In an embodiment, as long as a material has a light absorbing property, it may be used for the division pattern 310. The division pattern 310 may be a layer of black color, and in an embodiment, the division pattern 310 may include a black coloring agent. The black coloring agent may contain black dye or black pigment. The black coloring agent may contain metallic materials (e.g., carbon black and chromium) or oxides thereof.

The division pattern 310 may cover (or overlap) the second conductive layer 240 of the input sensor IS. The division pattern 310 may prevent a reflection issue of external light caused by the second conductive layer 240.

A second opening 310-OP2 may be defined in the division pattern 310. The second opening 310-OP2 may be overlapped with the first electrode AE of the emission element LD.

The color filter pattern 323 may be overlapped with the first electrode AE. The color filter pattern 323 may cover (or overlap) the second opening 310-OP2. The color filter pattern 323 may contact the division pattern 310.

The planarization layer 330 may cover the division pattern 310 and the color filter pattern 323. The planarization layer 330 may be formed of or include an organic material and may have a flat top surface. In an embodiment, the planarization layer 330 may be omitted.

Since the color filter layer 300 includes the color filter patterns 323 and the division pattern 310, it may reduce reflectance of external light, which is incident thereon from the outside of the display device DD. The color filter patterns 323 may be arranged in a specific shape. For example, the color filter patterns 323 may be arranged in consideration of light-emitting colors of the pixels included in the display panel DP.

In an embodiment, the input sensor IS may be omitted. In this case, the color filter layer 300 may be disposed directly on the display panel DP. As another example, the positions of the input sensor IS and the color filter layer 300 may be exchanged.

The damping layer DL described above may be disposed on the color filter layer 300. The display module DM may include the color filter layer 300, which is used instead of a polarization film. In this case, the damping layer DL may compensate an impact strength of the display module DM, which is lowered due to the absence of the polarization film. Since the display module DM includes the color filter layer 300 and the damping layer DL, an impact-resistant property of the display module DM may be maintained to an excellent level.

FIG. 6B illustrates some of elements forming the display module DM, and an adhesive layer may be disposed between the illustrated elements. For example, the adhesive layer may be disposed between the damping layer DL and the color filter layer 300. The adhesive layer will be described in more detail below.

Figure 7A:
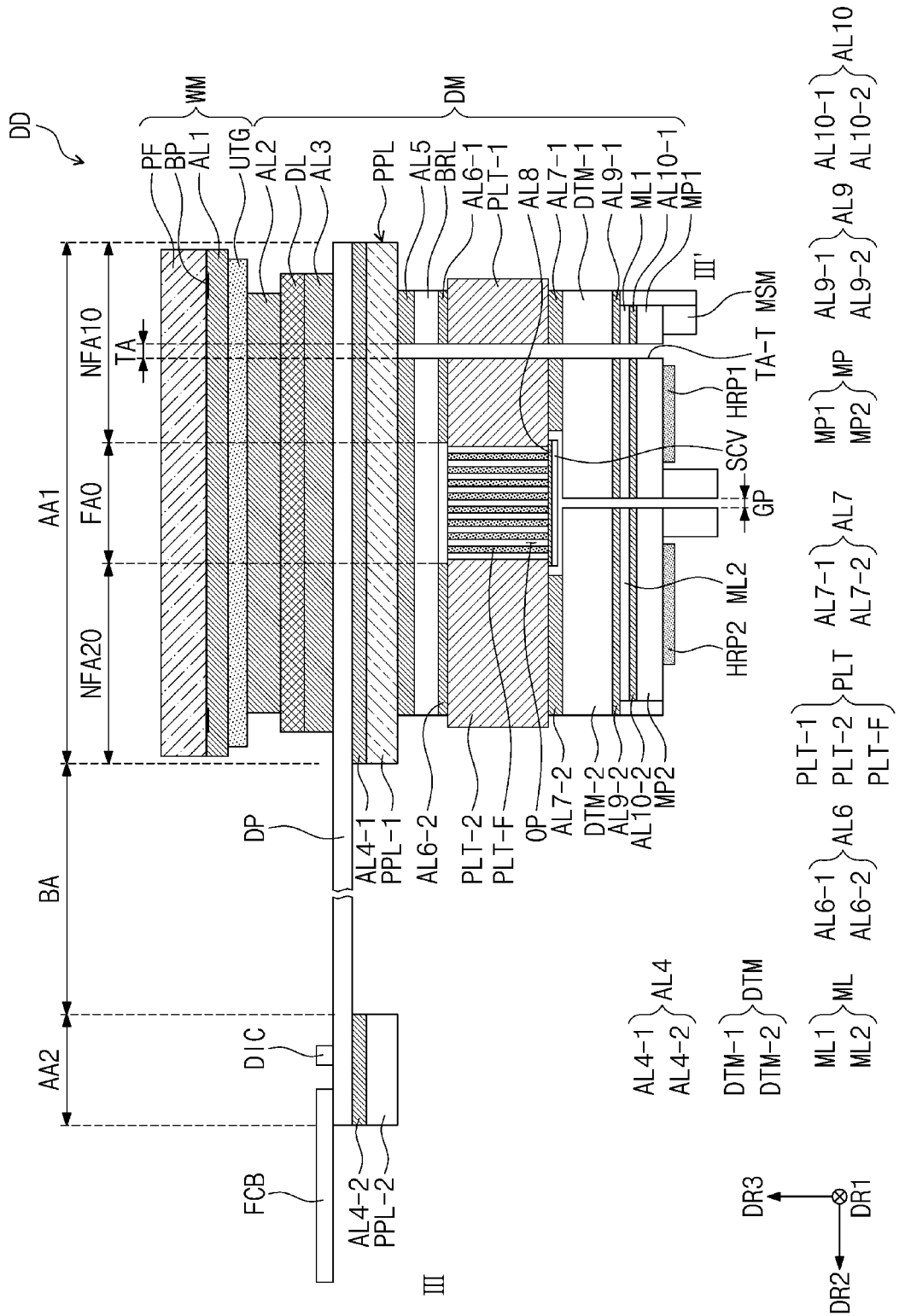
FIG. 7A is a cross-sectional view illustrating a display device according to an embodiment of the disclosure.
Figure 7B:
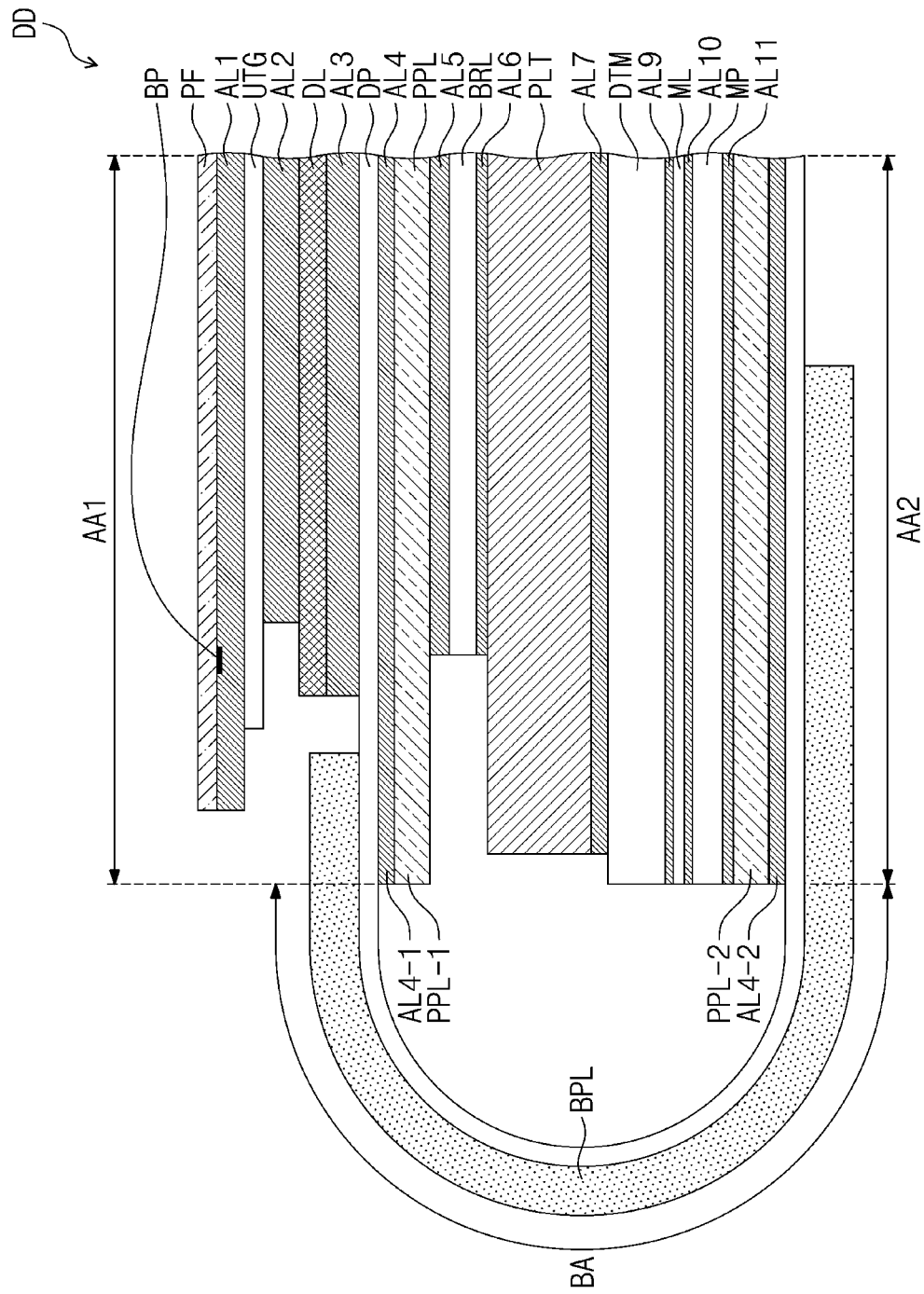
FIG. 7B is a cross-sectional view illustrating a display device according to an embodiment of the disclosure.

FIG. 7A is a schematic cross-sectional view illustrating the display device DD according to an embodiment of the disclosure. FIG. 7B is a schematic cross-sectional view illustrating the display device DD according to an embodiment of the disclosure.

Referring to FIGS. 7A and 7B, the display device DD may include the window module WM and the display module DM. The window module WM may be one of the window modules WM described with reference to FIGS. 4A and 4B, but the disclosure is not limited thereto.

The display module DM may include the damping layer DL, the display panel DP, a panel protection layer PPL, a barrier layer BRL, a support layer PLT, a cover layer SCV, a digitizer DTM, a metal layer ML, a metal plate MP, a heat-dissipation layer HRP, and fourth to tenth adhesive layers AL4 to AL10. The second to tenth adhesive layers AL2 to AL10 may include an adhesive agent (e.g., a pressure sensitive adhesive agent or an optically clear adhesive agent) and may have the same technical features as the first adhesive layer AU. In an embodiment, some of the afore-described elements may be omitted. For example, the metal plate MP or heat-dissipation layer HRP and the adhesive layer attached thereto may be omitted.

The damping layer DL may be disposed in the first region AA1. The damping layer DL may cover (or overlap) at least the active region DP-DA. The second adhesive layer AL2 may be used to attach the damping layer DL to the window module WM.

The third adhesive layer AL3 (or an upper adhesive layer) may be disposed directly on a bottom surface of the damping layer DL. For convenience in illustration, only the display panel DP is illustrated in FIG. 7A, but the color filter layer 300 and the input sensor IS may be further disposed between the display panel DP and the third adhesive layer AL3, as shown in FIG. 6B. In other words, the third adhesive layer AL3 may be used to attach the damping layer DL and the color filter layer 300 to each other.

In an embodiment, a thickness of the third adhesive layer AL3 may range from about 40 µm to about 60 µm (for example, from about 45 µm to about 55 µm).

Since the electronic device ED includes the damping layer DL, which has a thickness range of about 5 µm to about 30 µm and includes a polymeric material, and the third adhesive layer AL3, which has a thickness range of about 40 µm to about 60 µm, the electronic device ED may have an improved impact-resistant property.

The panel protection layer PPL may be disposed below the display panel DP. The panel protection layer PPL may protect a lower portion of the display panel DP. The panel protection layer PPL may be formed of or include at least one of flexible plastic materials. For example, the panel protection layer PPL may be formed of or include polyethylene terephthalate. In an embodiment, the panel protection layer PPL may not be disposed in the folding region FA. The panel protection layer PPL may include a first panel protection layer PPL-1 protecting the first region AA1 of the display panel DP and a second panel protection layer PPL-2 protecting the second region AA2.

The fourth adhesive layer or lower adhesive layer AL4 may be used to attach the panel protection layer PPL to the display panel DP. The fourth adhesive layer AL4 may include a first portion AL4-1 corresponding to the first panel protection layer PPL-1 and a second portion AL4-2 corresponding to the second panel protection layer PPL-2. A thickness of the fourth adhesive layer AL4 may range from about 20 µm to about 30 µm. For example, the thickness of the fourth adhesive layer AL4 may be about 25 µm. In case that the fourth adhesive layer AL4 has the thickness range, a modulus value of the fourth adhesive layer AL4 may be lowered, and in this case, it may be possible to reduce a failure or defect, such as a delamination failure of the adhesive layer or a crack in the display panel, which may occur in case that the folding operation of the electronic device ED is performed at low temperatures.

The following Table 2 summarizes results of an experiment of evaluating a low-temperature folding performance of an electronic device according to a thickness of a fourth adhesive layer and a thickness of the afore-described damping layer.

The item "Thickness of fourth adhesive layer" in Table 2 represents the thickness of the fourth adhesive layer AL4 described above.

The item "Thickness of damping/polarization layer" in Table 2 represents the thickness of the damping layer DL described above and represents the thickness of the polarization layer in Comparative Example 4, in which a polarization layer is used instead of the damping layer.

The item "Lowest temperature" in Table 2 represents the lowest temperature which does not cause a crack issue in the display panel in case that the folding operation of the electronic device is executed. The experiment was executed to examine whether a crack is formed in the display panel DP while the folding operation of the electronic device is repeated at an experiment temperature. The crack may be, for example, a crack formed in the encapsulation layer of the display panel DP.

Each of the electronic devices according to Embodiment 2 and Comparative Examples 2 and 3 was prepared to include the fourth adhesive layer and the damping layer and to have the thickness range given in Table 2. Except for the difference in thickness, the fourth adhesive layer and the damping layer were provided to have the technical features described above. For example, the damping layer was disposed on the display panel, and the fourth adhesive layer was disposed between the display panel and the panel protection layer.

The electronic device of Comparative Example 4 was prepared to include the fourth adhesive layer and to include the polarization layer, instead of the damping layer. The polarization layer and the damping layer was disposed at a same position (in detail, on the display panel).

An electronic device of a reference example was prepared to include the fourth adhesive layer, but not the damping layer and the polarization layer.

TABLE 2

| Evaluation Items | Embodiment 2 | Comparative Example 2 | Comparative Example 3 | Comparative Example 4 | Reference Example |
|---|---|---|---|---|---|
| Thickness of fourth adhesive layer (μm) | 25 | 25 | 18 | 18 | 18 |
| Thickness of damping/polarization layer (μm) | 23 | 40 | 40 | (31) | — |
| Lowest temperature (° C.) | −20 | −15 | −10 | −15 | −20 |

Table 2 shows that the folding operation of the electronic device according to Embodiment 2 can be executed at a temperature of −20° C., without damage to the display panel. For the electronic device according to embodiment 2, the folding operation was possible at a temperature that is lower than those in comparative examples 2, 3, and 4, without damage to the display panel. The lowermost temperature in Embodiment 2 was equal to the lowermost temperature in the reference example.

For the electronic device of the reference example, a reduced stress was exerted on the display panel during the folding operation, because the damping or polarization layer was not provided on the display panel.

For the electronic device according to an embodiment of the disclosure, since the fourth adhesive layer has a thickness range of about 20 μm to about 30 μm and the damping layer has a thickness range of about 5 μm to about 30 μm, the folding operation may be executed, without a failure, at the same temperature (for example, −20° C.) as that in the reference example. For example, although the electronic device according to an embodiment of the disclosure has the damping layer provided on the display panel, a stress exerted on the display panel may be reduced, as in the electronic device of the reference example, in which the damping or polarization layer is not provided.

Accordingly, the folding operation of the electronic device may have improved reliability at low temperatures.

In case that the bending region BA is bent as shown in FIG. 7B, the second panel protection layer PPL-2, along with the second region AA2, may be disposed below the first region AA1 and the first panel protection layer PPL-1. Since the panel protection layer PPL is not disposed in the bending region BA, the bending region BA may be more readily bent.

The bending region BA may have a specific curvature or a specific curvature radius. The curvature radius may range from about 0.1 mm to about 0.5 mm. At least a portion of a bending protection layer BPL may be disposed in the bending region BA. The bending protection layer BPL may be overlapped with the bending region BA, the first region AA1, and the second region AA2. The bending protection layer BPL may be disposed on a portion of the first region AA1 and a portion of the second region AA2.

The bending protection layer BPL may be bent, along with the bending region BA. The bending protection layer BPL may protect the bending region BA from an external impact and may control a stress in the bending region BA.

As shown in FIGS. 7A and 7B, the fifth adhesive layer AL5 may be used to attach the first panel protection layer PPL to the barrier layer BRL. The barrier layer BRL may be disposed below the panel protection layer PPL. The barrier layer BRL may improve a resistant property to a compressive force exerted by a pressure from the outside. Thus, the barrier layer BRL may prevent the display panel DP from being deformed. The barrier layer BRL may be formed of or include a flexible plastic material (e.g., polyimide or polyethylene terephthalate). The barrier layer BRL may be a colored film with low optical transmittance. The barrier layer BRL may absorb light that is incident thereon from the outside. For example, the barrier layer BRL may be a black plastic film. In case that a user sees the display device DD through a window protection layer PF, the user may not visually recognize elements disposed below the barrier layer BRL.

The sixth adhesive layer AL6 may be used to attach the barrier layer BRL to the support layer PLT. The sixth adhesive layer AL6 may include a first portion AL6-1 and a second portion AL6-2, which are spaced apart from each other.

In the embodiment, the first portion AL6-1 and the second portion AL6-2 may be two different portions of a single adhesive layer, but the disclosure is not limited thereto. In an embodiment, the first portion AL6-1 may be defined as an adhesive layer (e.g., a first adhesive layer), whereas the second portion AL6-2 may be defined as another adhesive layer (e.g., a second adhesive layer).

The support layer PLT may be disposed below the barrier layer BRL. The support layer PLT may be used to support elements disposed thereon and to maintain the display device DD in one of the unfolded and folded states. The support layer PLT may include a first supporting portion PLT-1 corresponding to the first non-folding region NFA10 and a second supporting portion PLT-2 corresponding to the second non-folding region NFA20. The first and second supporting portions PLT-1 and PLT-2 may be spaced apart from each other in the second direction DR2.

In the embodiment, the support layer PLT may further include a folding portion PLT-F in which openings OP are defined, and the folding portion PLT-F may be disposed in a region, which is located between the first and second supporting portions PLT-1 and PLT-2 and corresponds to the folding region FA0. The folding portion PLT-F may prevent a contamination material or foreign substances from entering a portion of the barrier layer BRL which is placed between the first and second supporting portions PLT-1 and PLT-2 and is opened during the folding operation. In an embodiment, the folding portion PLT-F may be omitted.

The first and second supporting portions PLT-1 and PLT-2 may be formed of or include at least one of materials which are selected to allow for loss-free or loss-less transmission of a magnetic field produced by a digitizer DTM which will be described below. The first and second supporting portions PLT-1 and PLT-2 may be formed of or include at least one of non-metallic materials. For example, the first and second supporting portions PLT-1 and PLT-2 may be formed of or include at least one of plastic materials and reinforced fibers. In an embodiment, the first and second supporting portions PLT-1 and PLT-2 may be formed of or include a same material.

Openings OP may be defined in a region of the support layer PLT corresponding to the folding region FA0. The flexibility of the support layer PLT may be improved by virtue of the presence of the openings OP. Since the sixth adhesive layer AL6 is not disposed in a region corresponding to the folding region FA0, the flexibility of the support layer PLT may be improved.

The cover layer SCV and the digitizer DTM may be disposed below the support layer PLT. The cover layer SCV may be disposed to be overlapped with the folding region FA0. The digitizer DTM may include a first digitizer DTM-1 and a second digitizer DTM-2, which are respectively overlapped with the first supporting portion PLT-1 and the second supporting portion PLT-2. A portion of each of the first and second digitizers DTM-1 and DTM-2 may be disposed below the cover layer SCV.

The seventh adhesive layer AL7 may be used to attach the support layer PLT to the cover layer SCV, and the eighth adhesive layer AL8 may be used to attach the cover layer SCV to the digitizer DTM. The seventh adhesive layer AL7 may include a first portion AL7-1, which is used to attach the first supporting portion PLT-1 to the first digitizer DTM-1, and a second portion AL7-2, which is used to attach the second supporting portion PLT-2 to the second digitizer DTM-2.

The cover layer SCV may be disposed between the first portion AL7-1 and the second portion AL7-2 in the second direction DR2. To prevent interference with the digitizer DTM in the unfolded state, the cover layer SCV may be spaced apart from the digitizer DTM. A sum of thicknesses of the cover layer SCV and the eighth adhesive layer AL8 may be smaller than a thickness of the seventh adhesive layer AL7.

The cover layer SCV may cover (or overlap) the openings OP, which is defined in the support layer PLT. The cover layer SCV may have an elastic modulus lower than that of the support layer PLT. For example, the cover layer SCV may be formed of or include at least one of thermoplastic polyurethane, rubber, and silicon, but the disclosure is not limited to this example.

The digitizer DTM may be referred to as an EMR sensing panel (or electromagnetic resonance sensing panel) and may include loop coils, which produce a magnetic field allowing for resonance with an electronic pen at a predetermined resonance frequency. The magnetic field produced by the loop coil may be applied to an LC resonance circuit which is composed of an inductor (for example, a coil) and a capacitor of the electronic pen. In case that the magnetic field is applied to the coil, a current flowing through the coil may be produced and may be delivered to the capacitor. Accordingly, the capacitor may be charged with the current delivered from the coil, and the charged current may be discharged to the coil. For example, the coil may emit the magnetic field of the resonance frequency. The magnetic field emitted by the electronic pen may be absorbed again by the loop coil of the digitizer DTM, and in this case, the digitizer DTM may determine a distance of the electronic pen from a touch screen.

The digitizer DTM may include the first digitizer DTM-1 and the second digitizer DTM-2. The first and second digitizers DTM-1 and DTM-2 may be disposed to be spaced apart from each other by a specific gap GP. The gap GP may range from about 0.3 mm to about 3 mm and may be disposed to correspond to the folding region FA0. The digitizer DTM will be described in more detail below.

The metal layer ML may be disposed below the digitizer DTM. The metal layer ML may include a first metal layer ML1 and a second metal layer ML2 which are respectively overlapped with the first supporting portion PLT-1 and the second supporting portion PLT-2. The metal layer ML may dissipate heat, which is produced during the operation of the digitizer DTM, to the outside. The metal layer ML may be used to transfer heat, which is produced in the digitizer DTM, to elements disposed therebelow. The metal layer ML may have an electric conductivity and a thermal conductivity that are higher than those of a metal plate to be described below. The metal layer ML may be formed of or include copper or aluminum.

The ninth adhesive layer AL9 may be used to attach the digitizer DTM to the metal layer ML. The ninth adhesive layer AL9 may include a first portion AL9-1 and a second portion AL9-2 corresponding to the first metal layer ML1 and the second metal layer ML2.

The metal plate MP may be disposed below the metal layer ML. The metal plate MP may include a first metal plate MP1 and a second metal plate MP2, which are respectively overlapped with the first metal layer ML1 and the second metal layer ML2. The metal plate MP may absorb an external impact in an upward direction.

The metal plate MP may have a strength (e.g., mechanical strength) and a thickness that are greater than those of the metal layer ML. The metal plate MP may be formed of or include a metallic material (e.g., stainless steel).

The tenth adhesive layer AL10 may be used to attach the metal layer ML to the metal plate MP. The tenth adhesive layer AL10 may include a first portion AL10-1 and a second portion AL10-2 respectively corresponding to the first metal plate MP1 and the second metal plate MP2.

The heat-dissipation layer HRP may be disposed below the metal plate MP. The heat-dissipation layer HRP may include a first heat-dissipation layer HRP1 and a second heat-dissipation layer HRP2, which are respectively overlapped with the first metal plate MP1 and the second metal plate MP2. The heat-dissipation layer HRP may be configured to dissipate heat generated from underlying electronic components. The electronic components may be or include the electronic module EM shown in FIGS. 2A and 2B. The heat-dissipation layer HRP may have a structure, in which adhesive and graphite layers are alternatively stacked. The outermost one of the adhesive layers may be attached to the metal plate MP.

A magnetic field shielding sheet MSM may be disposed below the metal plate MP. The magnetic field shielding sheet MSM may shield a magnetic field produced by a magnetic element (not shown) disposed therebelow. The magnetic field shielding sheet MSM may prevent the magnetic field, which is produced by the magnetic element, from disturbing the digitizer DTM.

The magnetic field shielding sheet MSM may include multiple portions. At least one of the portions may have a different thickness from the others. The portions may be disposed to correspond with a height difference produced by a bracket (not shown) disposed below the display device DD. The magnetic field shielding sheet MSM may have a structure, in which magnetic field shielding layers and adhesive layers are alternatively stacked. A portion of the magnetic field shielding sheet MSM may be directly attached to the metal plate MP.

The penetration hole TA-T may be formed to penetrate some elements of the lower member LM. The penetration hole TA-T may be disposed to be overlapped with the first active region DP-TA of FIG. 2A. As shown in FIG. 7A, the penetration hole TA-T may be formed to penetrate some element(s) of the lower member LM (e.g., from the fifth adhesive layer AL5 to the metal plate MP). The penetration hole TA-T may be an empty region, which is formed by removing light-blocking elements located on a propagation path of an optical signal, and thus, the efficiency in an optical signal receiving operation of the electro-optical module ELM may be improved by the penetration hole TA-T.

Figure 8:
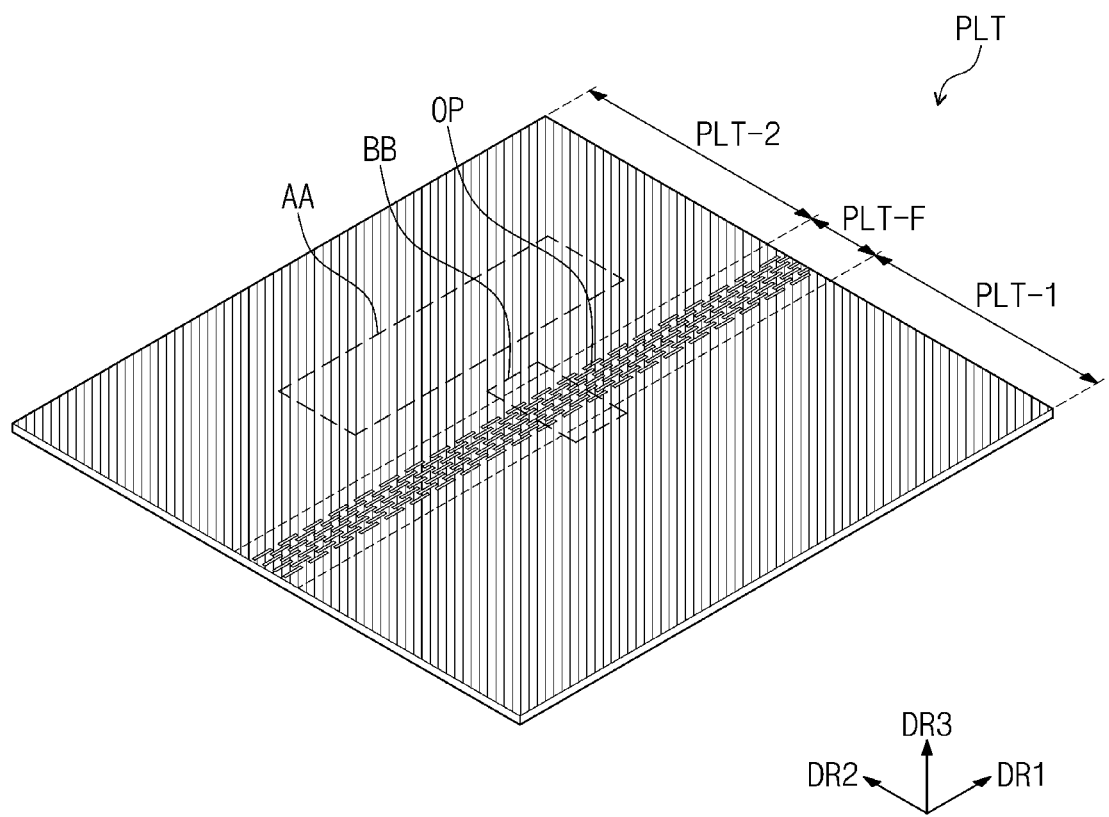
FIG. 8 is a schematic perspective view illustrating a support layer according to an embodiment of the disclosure.

FIG. 8 is a schematic perspective view illustrating the support layer PLT according to an embodiment of the disclosure.

Referring to FIG. 8, the support layer PLT may be divided into the first supporting portion PLT-1, the folding portion PLT-F, and the second supporting portion PLT-2, which are arranged in the second direction DR2. Openings OP may be defined in the folding portion PLT-F.

The support layer PLT may be formed of or include at least one of nonmetallic materials (e.g., reinforced fiber composite and plastic materials).

Figure 9A:
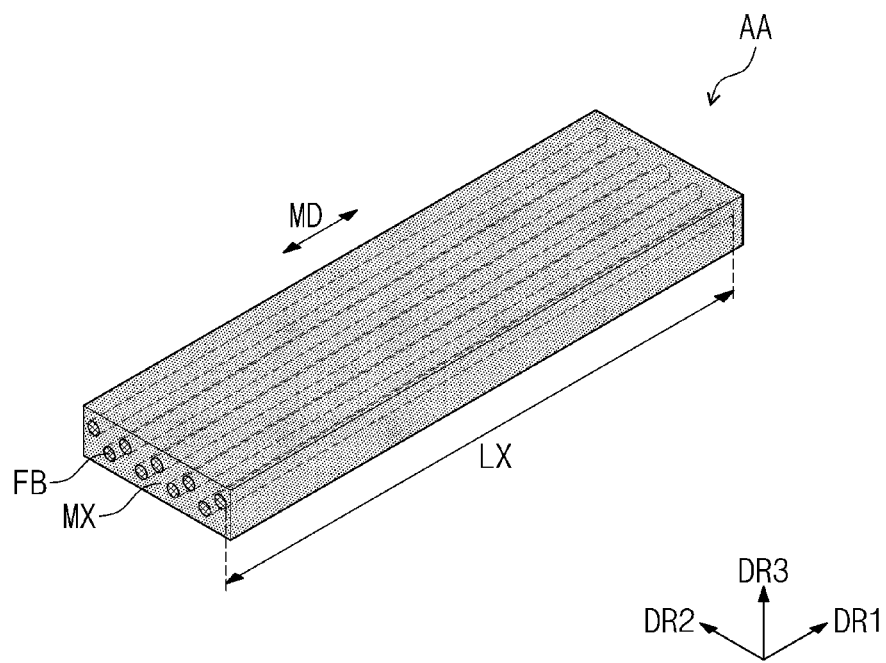
FIG. 9A is a perspective view illustrating a portion of a support layer according to an embodiment of the disclosure.
Figure 9B:
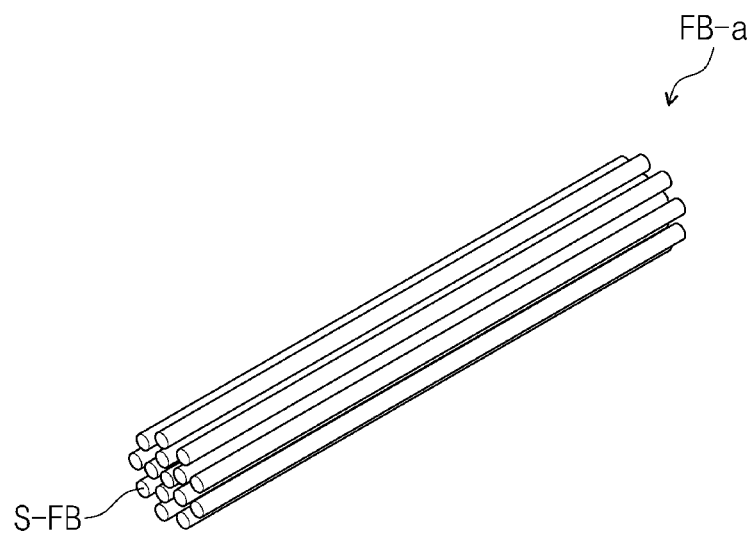
FIG. 9B is a schematic perspective view illustrating a reinforced fiber according to an embodiment of the disclosure.
Figure 9C:
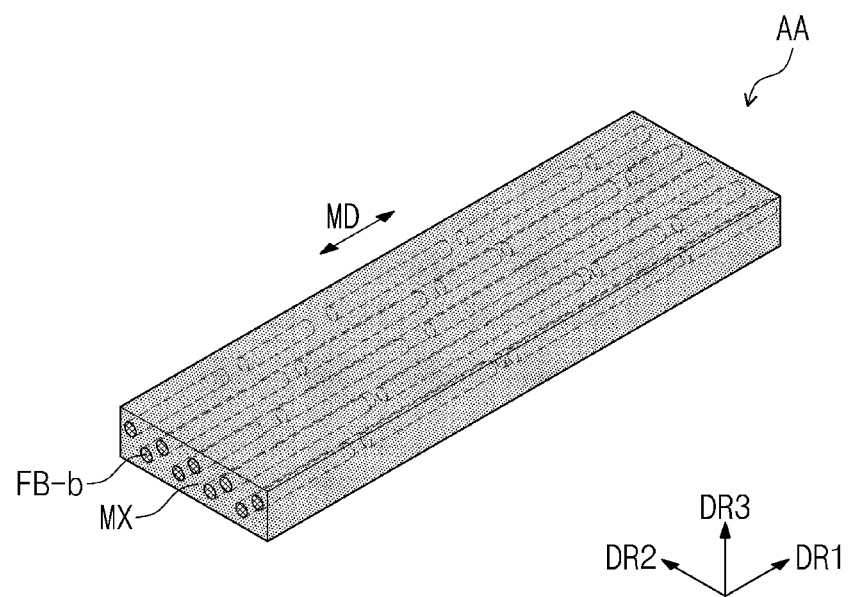
FIG. 9C is a schematic perspective view illustrating a portion of a support layer according to an embodiment of the disclosure.

FIG. 9A is a schematic perspective view illustrating a portion of the support layer PLT according to an embodiment of the disclosure. FIG. 9B is a schematic perspective view illustrating a reinforced fiber according to an embodiment of the disclosure. FIG. 9C is a schematic perspective view illustrating a portion of the support layer PLT according to an embodiment of the disclosure.

FIG. 9A illustrates an enlarged shape of portion AA of the support layer PLT shown in FIG. 8.

Referring to FIGS. 8 and 9A, the support layer PLT may include a reinforced fiber FB. In an embodiment, the support layer PLT may be formed of a reinforced fiber composite including reinforced fibers. The support layer PLT, which is formed to include the reinforced fiber composite, may further include a matrix MX. In an embodiment, the reinforced fibers FB may be arranged or distributed in the matrix MX.

The reinforced fiber FB may be a carbon fiber or a glass fiber. The matrix MX may be formed to include a polymer resin. The matrix MX may be formed of a thermoplastic resin. For example, the matrix MX may be formed of or include at least one of polyamide-based resins and polypropylene-based resins. In an embodiment, the reinforced fiber composite may be a carbon fiber reinforced plastic (CFRP) or a glass fiber reinforced plastic (GFRP).

The support layer PLT of the electronic device ED may be formed of or include a nonmetallic material including a reinforced fiber composite. In case that the support layer PLT includes the reinforced fiber composite, the magnetic field, which is produced by the digitizer DTM disposed below the support layer PLT, may not be affected by the support layer PLT. For example, since the electronic device ED includes the support layer PLT including the reinforced fiber composite and the digitizer DTM disposed below the support layer PLT, the digitizer DTM may have improved sensing sensitivity.

It may be possible to reduce a weight of the electronic device ED, because the support layer PLT includes the reinforced fiber composite. In an embodiment, since the support layer PLT includes the reinforced fiber composite, the support layer PLT may have a small or reduced weight and may have similar values of modulus and mechanical strength to a metal plate, compared with the case that the support layer PLT is formed of a metallic material. Accordingly, the electronic device according to an embodiment of the disclosure may have a reduced weight and improved mechanical and reliability properties, compared with the case that a metal supporting plate is used.

Furthermore, in case that the matrix MX includes a polymer resin, the shape of the support layer PLT may be easily processed compared to a metal plate. For example, the shape of the support layer PLT including the reinforced fiber composite may be processed using a laser cutting process. Openings OP, which will be described with reference to FIG. 10, may be defined in the support layer PLT by the laser cutting process.

The reinforced fiber FB may be extended in a direction, and in an embodiment, reinforced fibers FB may be arranged in parallel to each other in a direction, for example, a long axis direction LX. The long axis direction LX or an extension direction of the reinforced fiber FB may correspond to a machine direction MD in a process of forming the reinforced fiber composite. The machine direction MD may be referred to as a longitudinal direction and a direction perpendicular to the machine direction MD may be referred to as a transverse direction (TD).

In an embodiment, the support layer PLT may have a folding axis FX that is parallel to the extension direction or the long axis direction LX of the reinforced fiber FB. In other words, the support layer PLT may be a plate, which is elongated in the direction of the folding axis FX, or in which the long axis of the reinforced fiber FB is parallel to the folding axis FX.

In an embodiment, each of the reinforced fibers FB, which are included in the support layer PLT, may be composed of a single strand. Furthermore, in an embodiment, the reinforced fiber FB, which is included in the support layer PLT, may be a single strand that is elongated in the machine direction MD.

In an embodiment, the structure of the reinforced fiber composite included in the support layer PLT may be different from that shown in FIG. 9A. Referring to FIG. 9B, a reinforced fiber FB-a included in the support layer PLT may be composed of sub-fibers S-FB. For example, the sub-fibers S-FB may be grouped to form a single strand of the reinforced fiber FB-a.

Referring to FIG. 9C, a reinforced fiber FB-b, which is included in the support layer PLT, may not be continuously extended in the machine direction MD. For example, a length of the reinforced fiber FB-b in the long axis direction LX may be shorter than that of the reinforced fiber FB shown in FIG. 9A. In an embodiment shown in FIG. 9C, all of the reinforced fibers FB-b may have a long axis that is parallel to the machine direction MD. The reinforced fibers FB-b may be arranged or distributed in the matrix MX.

Figure 10:
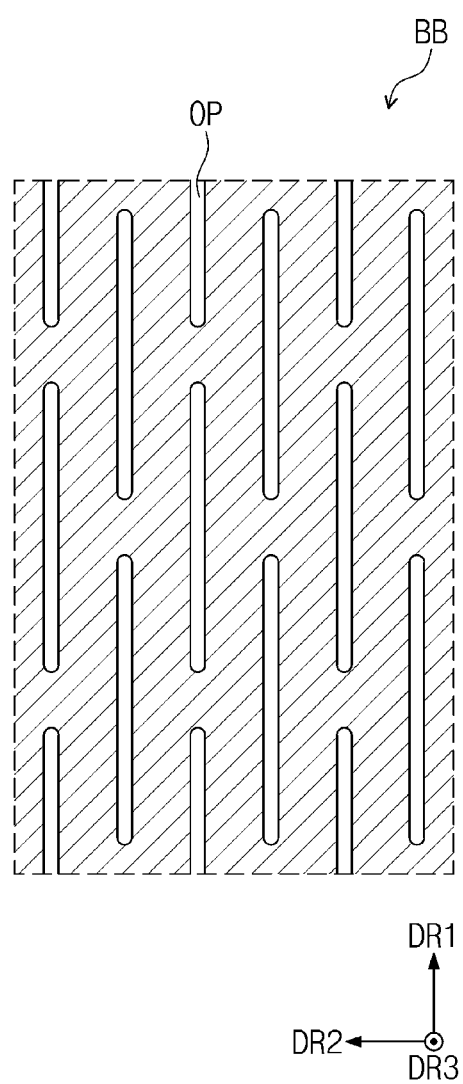
FIG. 10 is a schematic plan view illustrating a portion of a support layer according to an embodiment of the disclosure.

FIG. 10 is a schematic plan view illustrating a portion of the support layer PLT according to an embodiment of the disclosure.

FIG. 10 illustrates an enlarged structure of portion BB of the support layer PLT shown in FIG. 8.

Referring to FIGS. 8 and 10, openings OP may be defined in the folding portion PLT-F, and in this case, flexibility of the folding portion PLT-F may be improved. Since the support layer PLT is formed of the reinforced fiber composite, the opening OP may be easily patterned, compared to the case that the support layer PLT includes a metallic material.

Figure 11A:
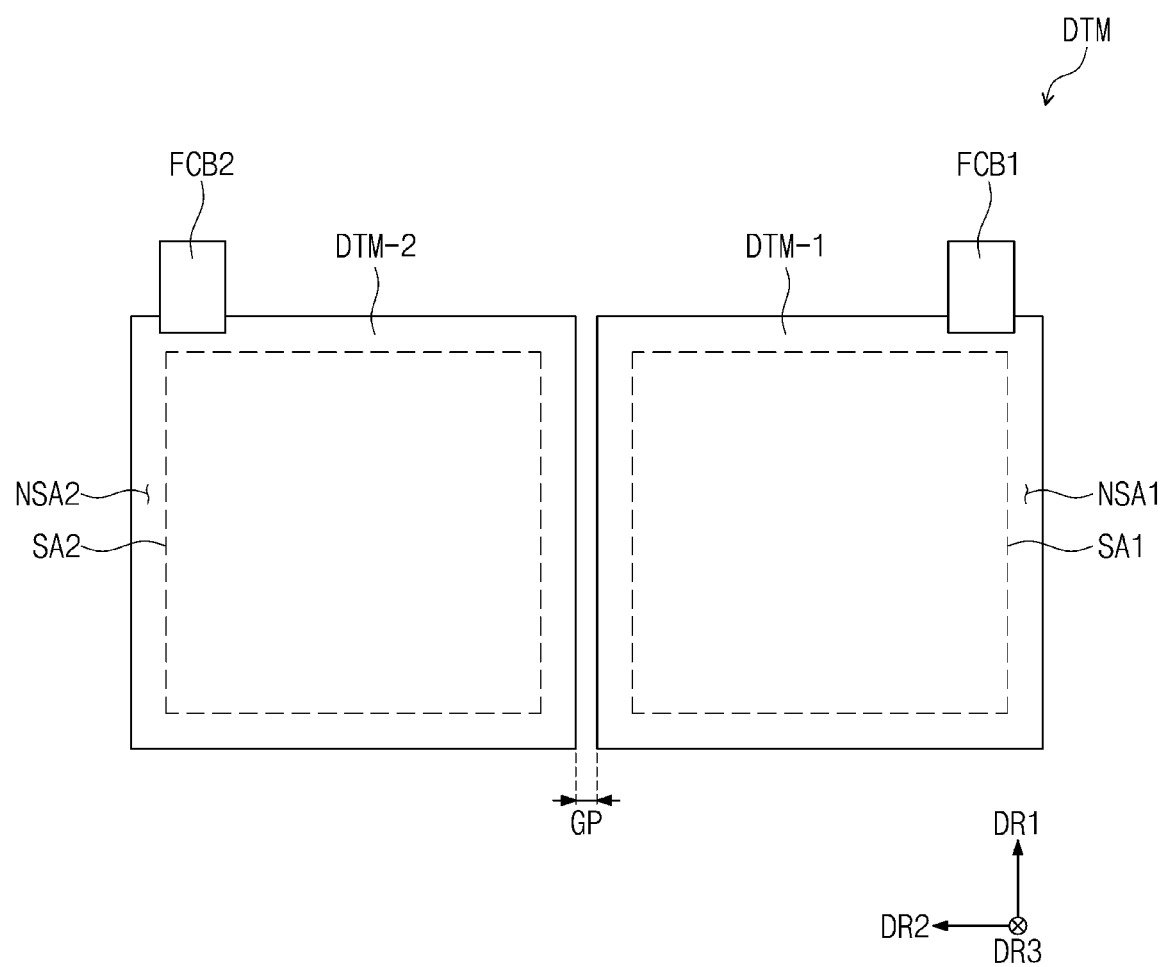
FIG. 11A is a schematic plan view illustrating a digitizer according to an embodiment of the disclosure.
Figure 11B:
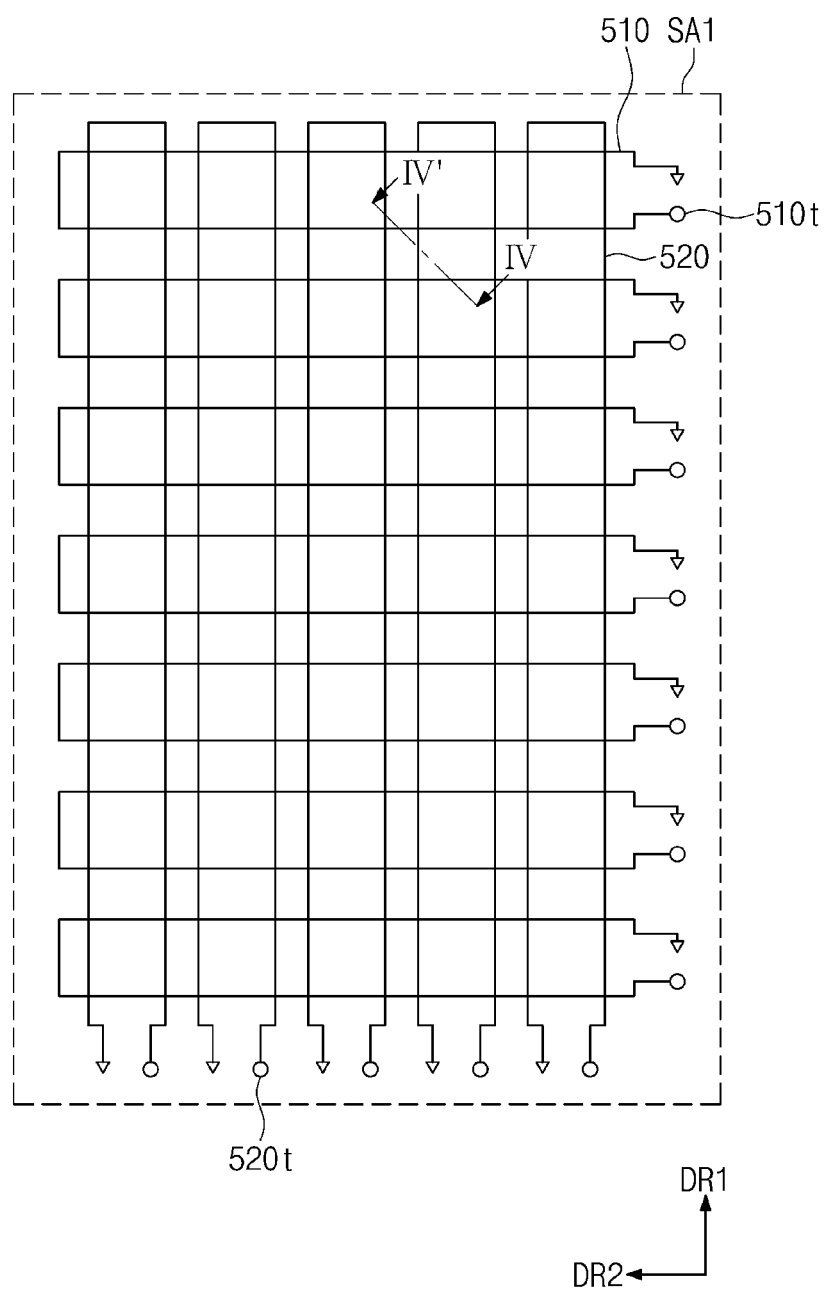
FIG. 11B is a schematic plan view illustrating a sensing region of a digitizer according to an embodiment of the disclosure.
Figure 11C:
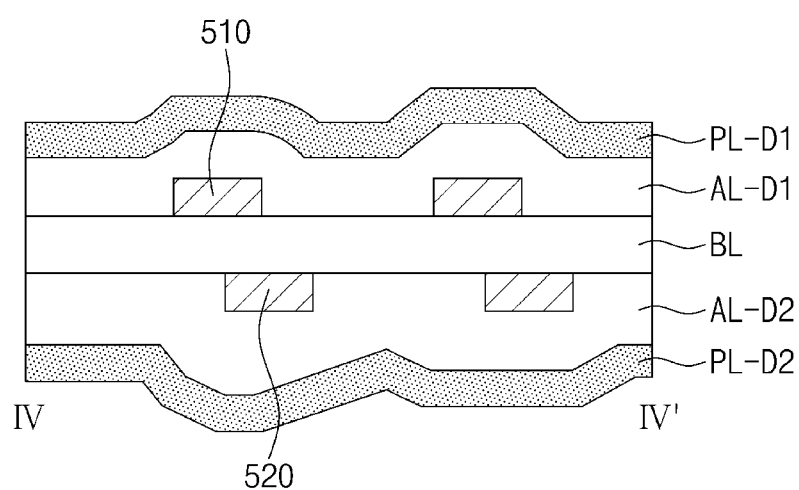
FIG. 11C is a cross-sectional view illustrating a sensing region of a digitizer according to an embodiment of the disclosure.

FIG. 11A is a schematic plan view illustrating the digitizer DTM according to an embodiment of the disclosure. FIG. 11B is a schematic plan view illustrating a sensing region SA1 of the digitizer DTM according to an embodiment. FIG. 11C is a schematic cross-sectional view illustrating the sensing region SA1 of the digitizer DTM according to an embodiment of the disclosure.

As shown in FIG. 11A, the digitizer DTM may include the first digitizer DTM-1 and the second digitizer DTM-2, which are spaced apart from each other. A first flexible circuit film FCB1 and a second flexible circuit film FCB2 may be respectively and electrically connected to the first and second digitizers DTM-1 and DTM-2. The first and second flexible circuit films FCB1 and FCB2 may be electrically connected to a same circuit board. Each of the first and second flexible circuit films FCB1 and FCB2 may be electrically connected to a main circuit board to which the flexible circuit film FCB described in FIG. 2A is electrically connected. The first and second flexible circuit films FCB1 and FCB2 may be replaced with a single circuit film.

The first digitizer DTM-1 and the second digitizer DTM-2 may include a first sensing region SA1 and a second sensing region SA2, respectively, and may include a first non-sensing region NSA1 and a second non-sensing region NSA2, respectively. The first non-sensing region NSA1 and the second non-sensing region NSA2 may be disposed adjacent to the first sensing region SA1 and the second sensing region SA2, respectively. The first and second digitizers DTM-1 and DTM-2 may have substantially a same structure, and thus, the first digitizer DTM-1 may be mainly described below.

As shown in FIG. 11B, first loop coils 510 (hereinafter referred to as first coils) and second loop coils 520 (hereinafter referred to as second coils) may be provided in the first sensing region SA1. The first coils 510 and the second coils 520 may be referred to as driving coils and sensing coils, respectively, but the disclosure is not limited thereto. For example, the first coils 510 and the second coils 520 may be used as the sensing coils and the driving coils, respectively.

The first coils 510 may be arranged in the first direction DR1 and may be extended in the second direction DR2. The second coils 520 may be extended in the first direction DR1 and may be arranged to be spaced from each other in the second direction DR2. Unlike those shown in FIG. 11B, the first coils 510 may be arranged such that adjacent ones of them are overlapped with each other. A bridge pattern may be disposed in an intersection region of the first coils 510. The second coils 520 may be arranged such that adjacent ones of them are overlapped with each other. A bridge pattern may be disposed in an intersection region of the second coils 520.

Alternating current (AC) signals may be sequentially provided to first terminals 510t of the first coils 510. The other terminals of the first coils 510, which are electrically connected to the first terminals 510t, may be grounded. Although not shown in FIG. 11B, signal lines may be electrically connected to the first terminals 510t of the first coils 510, respectively. The signal lines may be disposed in the first non-sensing region NSA1 shown in FIG. 11A.

In case that a current flows through the first coils 510, magnetic field lines may be induced between the first coils 510 and the second coils 520. The second coils 520 may output a sensing signal, which is produced by sensing an electromagnetic force induced by an electronic pen, to second terminals 520t of the second coils 520. The other terminals of the second coils 520, which are electrically connected to the second terminals 520t, may be grounded. Although not shown in FIG. 11B, signal lines may be electrically connected to the second terminals 520t of the second coils 520, respectively. The signal lines may be disposed in the first non-sensing region NSA1 shown in FIG. 11A.

As shown in FIG. 11C, the first digitizer DTM-1 may include a base layer BL, the first coils 510 disposed on a surface of the base layer BL, and the second coils 520 disposed on an opposite surface of the base layer BL. The base layer BL may include a plastic film (e.g., a polyimide film). The first coils 510 and the second coils 520 may be formed of or include at least one of metallic materials (e.g., gold (Au), silver (Ag), copper (Cu), or aluminum (Al)).

A protection layer may be disposed on opposite surfaces of the base layer BL to protect the first coils 510 and the second coils 520. In the embodiment, the protection layer may include a first protection layer PL-D1 which is disposed on the first coils 510 and is attached to the base layer BL by a first adhesive layer AL-D1, and a second protection layer PL-D2, which is disposed on the second coils 520 and is attached to the base layer BL by a second adhesive layer AL-D2. Each of the first protection layer PL-D1 and the second protection layer PL-D2 may be formed of or include a plastic material and may include, for example, a polyimide film.

As another example, a planarization layer (not shown) may be further disposed on the first protection layer PL-D1. Since the planarization layer is further provided, it may be possible to remove an uneven portion from the top surface of the digitizer DTM. A planarization layer may include at least one of a resin layer and an adhesive layer.

As described above, the first and second supporting portions PLT-1 and PLT-2 may include the reinforced fibers. Accordingly, a magnetic field produced by the digitizer DTM may pass through the support layer PLT, without a reduction in its intensity. The digitizer DTM disposed below the support layer PLT may sense an external input. In case that a metal-containing support layer is disposed on the digitizer DTM, a magnetic field generated by the digitizer DTM may be affected by the metallic material in the support layer, and this may lead to a sensing failure in the digitizer DTM. By contrast, according to an embodiment of the disclosure, since the nonmetallic support layer PLT is disposed on the digitizer DTM, the sensitivity of the digitizer DTM may be maintained to an excellent level.

Although the lower member LM of FIGS. 8 to 11C is illustrated to have a structure, in which the penetration hole TA-T is not provided, the penetration hole TA-T may be formed to be overlapped with the first display region TA, as described with reference to FIG. 7A.

Concretely, the penetration hole TA-T may be formed in a portion of the support layer PLT (e.g., one of the first and second supporting portions PLT-1 and PLT-2). For example, the penetration hole TA-T may be formed in the first supporting portion PLT-1.

Concretely, the penetration hole TA-T may be formed in a portion of the digitizer DTM (e.g., one of the first and second digitizers DTM-1 and DTM-2). For example, the penetration hole TA-T may be formed in the first digitizer DTM-1.

In an embodiment, the electronic device may include the damping layer, and in this case, an impact-resistant property of the electronic device may be improved.

In an embodiment, the electronic device may be configured to have the damping layer and the fourth adhesive layer having a specific thickness range, and this may make it possible to reliably execute the folding operation of the electronic device at low temperatures.

In an embodiment, the electronic device may include the support layer and the digitizer disposed below the support layer. Here, the support layer may be formed of or include a nonmetallic material, and in this case, it may be possible to improve the sensing sensitivity of the digitizer.

According to an embodiment of the disclosure, a display device may include a digitizer with improved sensing sensitivity.

According to an embodiment of the disclosure, a foldable display device may have an improved impact-resistant property.

According to an embodiment of the disclosure, a foldable display device may have high reliability even at low temperatures.

While example embodiments of the disclosure have been particularly shown and described, it will be understood by one of ordinary skill in the art that variations in form and detail may be made therein without departing from the spirit and scope of the attached claims.

What is claimed is:

1. A display device comprising:
   a window module that includes a thin glass substrate; and
   a display module including a first non-folding region, a second non-folding region, and a folding region disposed between the first non-folding region and the second non-folding region, wherein
   the display module comprises:
   a damping layer;
   a color filter layer;
   a display panel; and
   a lower member,
   the damping layer, color filter layer, display panel, and lower member are sequentially stacked below the window module, and
   the damping layer comprises polymer.

2. The display device of claim 1, wherein a thickness of the damping layer is in a range of about 5 μm to about 30 μm.

3. The display device of claim 1, wherein the window module further comprises:
   a window protection layer disposed on the thin glass substrate.

4. The display device of claim 3, wherein a modulus value of the damping layer is smaller than a modulus value of the window protection layer.

5. The display device of claim 1, further comprising:
   an upper adhesive layer, which is disposed directly on a bottom surface of the damping layer,
   wherein a thickness of the upper adhesive layer is in a range of about 40 μm to about 60 μm.

6. The display device of claim 1, further comprising:
   a panel protection layer disposed below the display panel; and
   a lower adhesive layer attaching the panel protection layer to the display panel,
   wherein a thickness of the lower adhesive layer is in a range of about 20 μm to about 30 μm.

7. The display device of claim 1, wherein the lower member comprises a support layer including a nonmetal and a digitizer disposed below the support layer.

8. The display device of claim 7, wherein the nonmetal is a reinforced fiber.

9. The display device of claim 1, wherein the damping layer comprises at least one of polyimide, polycarbonate, polyamide, triacetylcellulose, polymethylmethacrylate, and polyethylene terephthalate.

10. The display device of claim 1, wherein
    the lower member includes a penetration hole that overlaps at least one of the first non-folding region and the second non-folding region in a plan view, and
    the display panel overlaps the penetration hole in a plan view.

11. The display device of claim 1, further comprising an input sensor disposed between the color filter layer and the display panel.

12. The display device of claim 1, wherein
    the color filter includes a color filter pattern with a planarization layer disposed directly on the color filter pattern, and
    the damping layer is disposed directly on the planarization layer.

13. A display device comprising:
    a window module that includes a thin glass substrate;
    a display panel disposed below the window module, the display panel including:
    a first non-folding region;
    a second non-folding region; and
    a folding region;
    a color filter layer disposed on the display panel, the color filter layer comprising:
    color filter patterns; and
    a division pattern;
    a damping layer disposed on the color filter layer, the damping layer comprising polymer; and
    a lower member disposed below the display panel.

14. The display device of claim 13, wherein the lower member comprises:
    a panel protection layer disposed below the display panel;
    a support layer disposed below the panel protection layer, the support layer comprising a nonmetal; and
    a digitizer disposed below the support layer.

15. The display device of claim 14, wherein the nonmetal is a reinforced fiber.

16. The display device of claim 13, wherein a thickness of the damping layer is in a range of about 5 μm to about 30 μm.

17. A display device comprising:
    a display panel including:
    a first non-folding region;
    a second non-folding region; and
    a folding region;
    a color filter layer disposed on the display panel, the color filter layer comprising:
    color filter patterns; and
    a division pattern;
    a damping layer disposed on the color filter layer, the damping layer comprising polymer; and
    a lower member disposed below the display panel, wherein
    the lower member includes a penetration hole that overlaps at least one of the first non-folding region and the second non-folding region in a plan view, and
    the display panel overlaps the penetration hole in a plan view.

18. An electronic device comprising:
    a display device including:
    a first display region allowing for transmission of an optical signal;
    a second display region adjacent to the first display region; and
    a peripheral region adjacent to the second display region; and an electro-optical module disposed below the display device and overlapping the first display region in a plan view, the electro-optical module receiving the optical signal, wherein the display device comprises:
- a window module; and
- a display module including:
  - a first non-folding region;
  - a second non-folding region; and
  - a folding region disposed between the first non-folding region and the second non-folding region, the display module comprises:
- a damping layer;
- a color filter layer;
- a display panel; and
- a lower member, the damping layer, color filter layer, display panel, and lower member are sequentially stacked below the window module, and the damping layer comprises polymer.

19. The electronic device of claim 18, wherein the color filter layer comprises:
- color filter patterns; and
- a division pattern.

20. The electronic device of claim 18, wherein a thickness of the damping layer is in a range of about 5 μm to about 30 μm.

21. The electronic device of claim 18, wherein the electro-optical module comprises a camera module.

* * * * *